US010070521B2

(12) United States Patent
Fukuchi

(10) Patent No.: US 10,070,521 B2
(45) Date of Patent: Sep. 4, 2018

(54) SURFACE-TREATED COPPER FOIL

(71) Applicant: JX Nippon Mining & Metals Corporation, Tokyo (JP)

(72) Inventor: Ryo Fukuchi, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 0 days.

(21) Appl. No.: 14/388,838

(22) PCT Filed: Mar. 29, 2013

(86) PCT No.: PCT/JP2013/059454
§ 371 (c)(1),
(2) Date: Sep. 29, 2014

(87) PCT Pub. No.: WO2013/147115
PCT Pub. Date: Oct. 3, 2013

(65) Prior Publication Data
US 2015/0079415 A1    Mar. 19, 2015

(30) Foreign Application Priority Data
Mar. 29, 2012   (JP) .................... 2012-076710

(51) Int. Cl.
*H05K 1/09*      (2006.01)
*H05K 1/03*      (2006.01)
*H05K 1/02*      (2006.01)
*C23C 28/00*     (2006.01)
*C23C 30/00*     (2006.01)
*B32B 15/04*     (2006.01)
*C23C 22/24*     (2006.01)
*C23C 22/83*     (2006.01)
*H05K 3/38*      (2006.01)

(52) U.S. Cl.
CPC .............. *H05K 1/09* (2013.01); *C23C 22/24* (2013.01); *C23C 22/83* (2013.01); *C23C 30/00* (2013.01); *C23C 30/005* (2013.01); *H05K 1/0242* (2013.01); *H05K 1/0393* (2013.01); *H05K 3/382* (2013.01); *H05K 3/389* (2013.01); *C23C 2222/20* (2013.01); *H05K 2201/0141* (2013.01); *H05K 2201/032* (2013.01); *H05K 2201/0355* (2013.01); *Y10T 428/12056* (2015.01); *Y10T 428/1291* (2015.01); *Y10T 428/12556* (2015.01); *Y10T 428/12569* (2015.01); *Y10T 428/12847* (2015.01); *Y10T 428/12882* (2015.01); *Y10T 428/12903* (2015.01); *Y10T 428/12917* (2015.01); *Y10T 428/12937* (2015.01); *Y10T 428/26* (2015.01); *Y10T 428/263* (2015.01); *Y10T 428/27* (2015.01); *Y10T 428/273* (2015.01)

(58) Field of Classification Search
CPC ..... C23C 22/24; C23C 22/83; C23C 2222/20; C23C 28/30; C23C 28/00; C23C 28/34; C23C 28/324; C23C 30/00; C23C 30/005; Y10T 428/12847; Y10T 428/12903; Y10T 428/1291; Y10T 428/12882; Y10T 428/12556; Y10T 428/27; Y10T 428/12569; Y10T 428/26; Y10T 428/263; Y10T 428/12937; Y10T 428/12917; Y10T 428/273; Y10T 428/12056; B32B 15/04; B32B 15/20
See application file for complete search history.

(56) References Cited

U.S. PATENT DOCUMENTS

| | | | |
|---|---|---|---|
| 2004/0163842 A1 | 8/2004 | Okada et al. | |
| 2011/0088933 A1* | 4/2011 | Amou | H05K 3/385 174/257 |
| 2012/0285734 A1 | 11/2012 | Uno et al. | |
| 2013/0011690 A1* | 1/2013 | Arai | C25D 7/0614 428/548 |
| 2015/0079415 A1 | 3/2015 | Fukuchi | |

FOREIGN PATENT DOCUMENTS

| | | |
|---|---|---|
| JP | 59208896 | 11/1984 |
| JP | 60-15654 | 4/1985 |
| JP | 61-054592 | 11/1986 |
| JP | 61054592 | 11/1986 |
| JP | 63315213 | 12/1988 |
| JP | 3-34679 | 5/1991 |
| JP | 05055746 B2 | 3/1993 |

(Continued)

OTHER PUBLICATIONS

JX Nippon Mining & Metals Philippines, Electro-deposited Copper Foil Products, no date, two pages, downloaded from http://www.nmm.jx-group.co.jp/english/philippines, Sep. 29, 2015.*
Sigma-Aldrich, (3-Aminopropyl)triethoxysilane, no date, three pages, downloaded from http://www.sigmaaldrich.com, Sep. 29, 2015.*
Machine Translation, Yamada et al., JP 09-306472, Nov. 1997.*
International Preliminary Report on Patentability for Application No. PCT/JP2013/059454 dated Oct. 9, 2014.
Search Report in Application No. PCT/JP2013/059454 dated Jun. 25, 2013.

(Continued)

*Primary Examiner* — Michael E. La Villa
(74) *Attorney, Agent, or Firm* — Marshall, Gerstein & Borun LLP

(57) ABSTRACT

This surface-treated copper foil is characterized in that the amount of adhesion of Si on the copper foil surface is from 3.1 to 300 µg/dm$^2$, and the amount of adhesion of N on the copper foil surface is from 2.5 to 690 µg/dm$^2$. The objective of the present invention is to obtain a copper foil having improved peel strength in providing a copper foil for a flexible printed substrate (FPC), in which a copper foil is laminated to a liquid crystal polymer (LCP) suitable for high-frequency applications.

16 Claims, No Drawings

(56) References Cited

FOREIGN PATENT DOCUMENTS

| | | | |
|---|---|---|---|
| JP | 7-331454 | | 12/1995 |
| JP | 09-306472 | * | 11/1997 |
| JP | 2003-193211 A | | 7/2003 |
| JP | 2003-291256 A | | 10/2003 |
| JP | 2008118163 A | | 5/2008 |
| JP | 2011-091066 A | | 5/2011 |
| JP | 2011168887 A | | 9/2011 |
| JP | 2012-041626 A | | 3/2012 |
| JP | 2015180777 A | | 10/2015 |
| JP | 5886416 B2 | | 3/2016 |
| WO | WO2011/090175 | * | 7/2011 |
| WO | WO-2011138876 A1 | | 11/2011 |
| WO | WO-2013/0147116 A1 | | 10/2013 |

OTHER PUBLICATIONS

Official action in Application No. JP 2014-508073 dated Jul. 15, 2014.
Office Action in TW Application No. 105121541 dated Jan. 4, 2017, 6 pages.
Takahashi et al., "Effect and Use of Silane Coupling Agent in Copper Foil", Effect and Use of Silane Coupling Agent, Science and Technology Co., Ltd., Oct. 10, 2007, Second Impression of the First Edition, pp. 140-149.
Office Action in JP Application No. 2015-210138 dated Jan. 4, 2017, 8 pages.
Office Action in Chinese Application No. 2015-095252 dated Jun. 23, 2016, 7 pages.

* cited by examiner

SURFACE-TREATED COPPER FOIL

This is a U.S. national phase application under 35 U.S.C. § 371 of International Application No. PCT/JP2013/059454, filed on Mar. 29, 2013, entitled "Surface-treated Copper Foil," which claims the priority of Japanese Patent Application No. 2012-076710 filed Mar. 29, 2012, the entire respective disclosures of which are incorporated herein by reference.

TECHNICAL FIELD

The present invention relates to a surface-treated copper foil for a copper-clad laminate for producing a flexible printed wiring board (FPC) which allows transmission of high frequency electric signals with good efficiency.

BACKGROUND ART

A flexible printed wiring board is produced by etching a copper foil of a substrate to form various wiring patterns and connecting electronic components with solder to mount the same. A copper foil is classified into an electrolytic copper foil and a rolled copper foil according to the methods for producing the same, and the rolled copper foil which is excellent in flexing resistance has been preferably used as a copper foil for a flexible substrate. Further, in electronic devices such as personal computers and mobile communications, a higher-frequency electric signal has been used with an increase in speed and capacity of communication, and a printed wiring board and a copper foil which can meet the trend have been required.

A higher-frequency electric signal has been used in electronic equipment such as personal computers and mobile communications, but when the frequency of an electric signal is increased to 1 GHz or greater, the influence of skin effect in which current flows only through the surface of a conductor becomes remarkable, and the influence in which a current transmission path is changed by surface unevenness to increase conductor loss cannot be ignored. Also from this point of view, the surface roughness of a copper foil is desired to be small.

The surface of a raw electrolytic copper foil is formed of electrodeposited particles of copper, and the surface of a raw rolled copper foil is formed by contact with a reduction roll. Therefore, the surface roughness of the raw rolled copper foil is generally smaller than the surface roughness of the electrolytic copper foil. Further, the rolled copper foil is finer than electrodeposited particles in roughening treatment. From this meaning, it can be said that a rolled copper foil is excellent as a copper foil for high frequency circuits.

On the other hand, data transportation volume is increased with the increase in frequency, but the circuit length of FPC is limited because the loss (damping) of signal power is also increased and the data cannot be read. In order to reduce such loss (damping) of signal power, the surface roughness of a copper foil tends to be smaller on the conductor side, and the resin side tends to be shifted from polyimide to a liquid crystal polymer. Note that a copper foil with small roughness in which a roughening treatment layer is not formed will probably be most desirable from the point of view of skin effect.

The loss (damping) of the signal power in an electronic circuit can roughly be divided into two. One of them is conductor loss, that is, the loss by a copper foil, and the other is dielectric loss, that is, the loss by a substrate. The conductor loss has characteristics that, in a high frequency area, there is a skin effect and current flows through the surface of the conductor. Therefore, when a copper foil surface is rough, current will flow through a complicated path. As described above, since a rolled copper foil has smaller roughness than an electrolytic copper foil, the rolled copper foil tends to have a smaller conductor loss.

On the other hand, a liquid crystal polymer (LCP) is a polymer which shows optical anisotropy in a liquid phase (melting or solution), and the polymer needs to be laminated to a copper foil without an adhesive. A wholly aromatic polyester-based liquid crystal polymer is a halogen-free material which shows molecular orientation even in a molten state, maintains the molecular orientation even in a solid state, and shows thermoplasticity.

The liquid crystal polymer (LCP) is characterized by a lower dielectric constant and a low dielectric tangent. Incidentally, LCP has a relative dielectric constant of 3.3, while polyimide has a relative dielectric constant of 3.5 and LCP has a dielectric dissipation factor of 0.002, while polyimide has a dielectric dissipation factor of 0.01. Thus, the liquid crystal polymer (LCP) has better characteristics than polyimide. Further, the liquid crystal polymer (LCP) is characterized by a low water absorption property and a low coefficient of moisture absorption, and has a large advantage of a small change in electrical properties and a small dimensional change.

The rolled copper foil is characterized in that a rolled material obtained by rolling after final annealing is the best for the purpose of maintaining handleability (for example, refer to Patent Literature 1).

However, the liquid crystal polymer (LCP) has a large problem of having low strength as compared with polyimide so that a material to which a copper foil is laminated hardly shows high peel strength. If roughness of a copper foil is increased, peel strength will tend to be high because a physical anchor effect is obtained, but electrical properties at high frequency will get worse due to the influence of the skin effect as described above.

Further, although there are several proposals of a copper foil for high frequency circuits (for example, refer to Patent Literatures 2, 3, 4, and 5), there is no effective technique under the present circumstances from the point of view of simplification of a process for producing a rolled copper foil and reducing high frequency transmission loss.

CITATION LIST

Patent Literature

Patent Literature 1:
Japanese Patent Laid-Open No. 2003-193211
Patent Literature 2:
Japanese Patent Publication No. 61-54592
Patent Literature 3:
Japanese Patent Publication No. 3-34679
Patent Literature 4:
Japanese Patent Publication No. 7-10564
Patent Literature 5:
Japanese Patent Laid-Open No. 5-55746

SUMMARY OF INVENTION

Technical Problem

The present invention has been made in view of the problems as described above, and the objective of the present invention is to obtain a copper foil having improved peel strength in providing a copper foil for a flexible printed substrate (FPC), in which a copper foil is laminated to a liquid crystal polymer (LCP) suitable for high-frequency applications.

Solution to Problem

The present inventors have found that transmission loss can be reduced for the following reasons.

First, transmission loss is greatly influenced by the surface of a copper foil in a high frequency region. Transmission loss increases with the increase in surface roughness. Therefore, it is effective to control the surface roughness of a copper foil as small as possible.

Secondly, a liquid crystal polymer (LCP) laminated substrate is used. However, it is necessary to increase adhesive strength (peel strength) with a copper foil for this purpose.

By solving the above problems, a finding has been obtained that a flexible printed substrate (FPC) in which signal power loss (damping) is suppressed can be provided.

Based on the above finding, the present invention provides the following inventions.

1) A surface-treated copper foil, wherein the amount of adhesion of Si on a copper foil surface is from 3.1 to 300 μg/dm$^2$, and the amount of adhesion of N on a copper foil surface is from 2.5 to 690 μg/dm$^2$.

2) The surface-treated copper foil according to the above 1), wherein the amount of adhesion of Si on the copper foil surface is from 10.0 to 300 μg/dm$^2$, and the amount of adhesion of N on the copper foil surface is from 8.0 to 690 μg/dm$^2$.

3) The surface-treated copper foil according to the above 1), wherein the amount of adhesion of Si on the copper foil surface is from 20.5 to 245 μg/dm$^2$, and the amount of adhesion of N on the copper foil surface is from 16.4 to 565 μg/dm$^2$.

4) The surface-treated copper foil according to any one of the above 1) to 3), wherein the copper foil is a copper foil for a flexible printed circuit substrate.

5) The surface-treated copper foil according to any one of the above 1) to 4), wherein the copper foil is a rolled copper foil or an electrolytic copper foil.

6) The surface-treated copper foil according to any one of the above 1) to 5), wherein the copper foil is a copper foil to be joined to a flexible printed circuit substrate comprising a liquid crystal polymer.

7) The surface-treated copper foil according to any one of the above 1) to 6), wherein ordinary peel strength at 90 degrees is 0.3 kg/cm or greater when the copper foil is joined to the flexible printed circuit substrate comprising a liquid crystal polymer.

8) The surface-treated copper foil according to any one of the above 1) to 7), wherein the copper foil is joined to a flexible printed circuit board which can be used at a high frequency exceeding 1 GHz.

Advantageous Effects of Invention

A surface-treated copper foil for high frequency circuit applications can be produced by the present invention, and application of the copper foil to a liquid crystal polymer (LCP) laminated substrate allows adhesive strength (peel strength) to be increased and provides an excellent effect that a flexible printed circuit board which can be used at a high frequency exceeding 1 GHz can be achieved.

DESCRIPTION OF EMBODIMENTS

The surface-treated copper foil which can be used for high frequency circuit applications is characterized in that the amount of adhesion of Si on the copper foil surface is from 3.1 to 300 μg/dm$^2$, and the amount of adhesion of N on the copper foil surface is from 2.5 to 690 μg/dm$^2$. This allows it to increase adhesive strength (peel strength) when the copper foil is bonded to a liquid crystal polymer (LCP) laminated substrate. Note that one means for achieving the above amount of adhesion of Si and N on the copper foil surface includes silane treatment of the copper foil surface. Further, it is effective to use the surface-treated copper foil of the present application as a copper foil for high frequency circuits.

If the amount of adhesion of Si on the copper foil surface is less than 3.1 μg/dm$^2$ and the amount of adhesion of N on the copper foil surface is less than 2.5 μg/dm$^2$, the adhesive strength will not be sufficient; and if the amount of adhesion of Si on the copper foil surface exceeds 300 μg/dm$^2$ and the amount of adhesion of N on the copper foil surface exceeds 690 μg/dm$^2$, foaming will occur when laminated to LCP. Therefore, it can be said that an excessive amount of adhesion is not preferred.

Particularly, it is desirable that the amount of adhesion of Si on the copper foil surface be from 8.0 to 300 μg/dm$^2$ and the amount of adhesion of N on the copper foil surface be from 8.0 to 690 μg/dm$^2$, and it is more desirable that the amount of adhesion of Si on the copper foil surface be from 20.5 to 245 μg/dm$^2$ and the amount of adhesion of N on the copper foil surface be from 16.4 to 565 μg/dm$^2$.

Note that a method for applying silane may be any of spraying, coater application, immersion, pouring, and the like of a silane coupling agent solution. Since these are already known techniques (for example, refer to Japanese Patent Publication No. 60-15654), details will be omitted.

With respect to the amount of adhesion of Si on the copper foil surface, a surface-treated copper foil having a size of 1 dm×1 dm was dissolved with an acid and quantitatively analyzed by ICP (inductively coupled plasma atomic emission spectrometry), thereby determining the mass (μg) of adhering Si per unit area of the surface-treated copper foil.

With respect to the amount of adhesion of N on the copper foil surface, a surface-treated copper foil having a size of 1 dm×1 dm was melted at a high temperature; the amount of adhesion of N was calculated from $NO_2$ generated; and the amount of N attached to the entire surface of the copper foil was measured, thereby determining the mass of adhering N per unit area of the surface-treated copper foil.

A copper foil having increased adhesive strength is an optimum copper foil for high frequency circuits as a copper foil for a flexible printed circuit substrate comprising a liquid crystal polymer. That is, such a copper foil allows an ordinary peel strength at 90 degrees of 0.3 kg/cm or greater when the copper foil is joined to the flexible printed circuit substrate comprising a liquid crystal polymer.

Further, since the adhesive strength of a copper foil can be increased, the technique can be applied to a rolled copper foil and an electrolytic copper foil each having a small surface roughness (small conductor loss) of the copper foil, and an optimum copper foil for high frequency circuits can be obtained. The copper foil for high frequency circuits allows production of a flexible printed circuit board which can be used at a high frequency exceeding 1 GHz.

Note that the surface-treated copper foil according to the present invention may have a roughening treatment layer and/or a heat-resistant treatment layer and/or a rust-proofing treatment layer and/or a chromate treatment layer and/or a plating treatment layer and/or a silane coupling treatment layer. The roughening treatment layer is not particularly limited, and all roughening treatment layers and known roughening treatment layers can be applied.

The heat-resistant treatment layer is not particularly limited, and all heat-resistant treatment layers and known heat-resistant treatment layers can be applied. The rust-proofing treatment layer is not particularly limited, and all rust-proofing treatment layers and known rust-proofing treatment layers can be applied. The plating treatment layer is not particularly limited, and all plating treatment layers and known plating treatment layers can be applied. The chromate treatment layer is not particularly limited, and all chromate treatment layers and known chromate treatment layers can be applied.

For example, the surface-treated copper foil according to the present invention may be provided with a roughening treatment layer on the surface thereof by performing roughening treatment, for example, for improving adhesion with an insulating substrate or the like. The roughening treatment can be performed, for example, by forming roughening particles with copper or a copper alloy. The roughening treatment may be fine. The roughening treatment layer may be such as a layer made of any elementary substance or an alloy containing one or more elementary substances selected from the group consisting of copper, nickel, phosphorus, tungsten, arsenic, molybdenum, chromium, cobalt, and zinc.

Further, it is also possible to form roughening particles with copper or a copper alloy and then further perform roughening treatment for providing secondary particles and tertiary particles with an elementary substance or an alloy or the like of nickel, cobalt, copper, and zinc. After that, a heat-resistant treatment layer or a rust-proofing treatment layer may be formed with an elementary substance or an alloy or the like of nickel, cobalt, copper, and zinc, and treatment such as chromate treatment and silane coupling treatment may be further performed on the surface thereof. Alternatively, without performing roughening treatment, a heat-resistant treatment layer or a rust-proofing treatment layer may be formed with an elementary substance or an alloy or the like of nickel, cobalt, copper, and zinc, and treatment such as chromate treatment and silane coupling treatment may be further performed on the surface thereof.

That is, one or more layers selected from the group consisting of a heat-resistant treatment layer, a rust-proofing treatment layer, a chromate treatment layer, and a silane coupling treatment layer may be formed on the surface of the roughening treatment layer; or one or more layers selected from the group consisting of a heat-resistant treatment layer, a rust-proofing treatment layer, a chromate treatment layer, and a silane coupling treatment layer may be formed on the surface of the surface-treated copper foil. Note that the heat-resistant layer, the rust-proofing treatment layer, the chromate treatment layer, and the silane coupling treatment layer may be formed in a plurality of layers, respectively (for example, two layers or more, three layers or more, and the like). Note that in the present invention, the "rust-proofing treatment layer" includes the "chromate treatment layer".

Note that when adhesion with a resin is taken into consideration, it is preferred to provide a silane coupling treatment layer as the outermost layer of the surface-treated copper foil. It is preferred that, as the roughening treatment layer, a primary particle layer of copper be formed, and a secondary particle layer made of a ternary alloy comprising copper, cobalt, and nickel be formed on the primary particle layer.

Further, it is more preferred that the primary particle layer has an average particle size of 0.25 to 0.45 µm, and the secondary particle layer has an average particle size of 0.05 to 0.25 µm.

The following treatment can be used as rust-proofing treatment or chromate treatment.

<Ni—Co Plating>: Ni—Co Alloy Plating
Solution composition) Co: 1 to 20 g/L, Ni: 1 to 20 g/L
(pH) 1.5 to 3.5
(Solution temperature) 30 to 80° C.
(Current density) 1 to 20 A/dm$^2$
(Current-carrying time) 0.5 to 4 seconds
<Zn—Ni Plating>: Zn—Ni Alloy Plating
(Solution composition) Zn: 10 to 30 g/L, Ni: 1 to 10 g/L
(pH) 3 to 4
(Solution temperature) 40 to 50° C.
(Current density) 0.5 to 5 A/dm$^2$
(Current-carrying time) 1 to 3 seconds
<Ni—Mo Plating>: Ni—Mo Alloy Plating
(Solution composition) nickel sulfate: 270 to 280 g/L, nickel chloride: 35 to 45 g/L, nickel acetate: 10 to 20 g/L, molybdenum (added as sodium molybdate): 0.1 to 10 g/L, trisodium citrate: 15 to 25 g/L, a brightening agent: saccharin, butynediol, or the like, sodium dodecyl sulfate: 55 to 75 ppm
(pH) 4 to 6
(Solution temperature) 55 to 65° C.
(Current density) 1 to 11 A/dm$^2$
(Current-carrying time) 1 to 20 seconds
<Cu—Zn Plating>: Cu—Zn Alloy Plating
(Solution composition) NaCN: 10 to 30 g/L, NaOH: 40 to 100 g/L, Cu: 60 to 120 g/L, Zn: 1 to 10 g/L
(Solution temperature) 60 to 80° C.
(Current density) 1 to 10 A/dm$^2$
(Current-carrying time) 1 to 10 seconds
<Electrolytic Chromate>
(Solution composition) chromic anhydride, chromic acid, or potassium dichromate: 1 to 10 g/L, zinc (added in the form of zinc sulfate, when added): 0 to 5 g/L
(pH) 0.5 to 10
(Solution temperature) 40 to 60° C.
(Current density) 0.1 to 2.6 A/dm$^2$
(Coulomb amount) 0.5 to 90 As/dm$^2$
(Current-carrying time) 1 to 30 seconds
<Immersion Chromate>
(Solution composition) chromic anhydride, chromic acid, or potassium dichromate: 1 to 10 g/L, zinc (added in the form of zinc sulfate, when added): 0 to 5 g/L
(pH) 2 to 10
(Solution temperature) 20 to 60° C.
(Treatment time) 1 to 30 seconds Further, when Si and N are allowed to adhere to the surface of a copper foil in silane coupling treatment, aminosilane is used for the silane coupling treatment. Then, it is necessary to perform the silane coupling treatment in the state where the concentration of the silane coupling agent in a silane coupling treatment solution is higher than conventionally (for example, 1.5 vol % or greater). Further, it is necessary not to set drying temperature after the silane coupling treatment to an excessively high temperature, and not to excessively increase drying time. This is because the silane coupling agent present on a copper foil surface may desorb when drying temperature is excessively high or drying time is excessively increased.

The drying after the silane coupling treatment is performed, for example, at a drying temperature of 90 to 110°

C., preferably 95° C. to 105° C. for a drying time of 1 to 10 seconds, preferably 1 to 5 seconds.

Further, in a preferred embodiment, a silane containing one or more amino groups and/or imino groups can be used as aminosilane. The number of amino groups and imino groups contained in aminosilane may be, for example, 1 to 4, preferably 1 to 3, more preferably 1 to 2, respectively. In a suitable embodiment, the number of amino groups and imino groups contained in aminosilane may be one, respectively.

An aminosilane in which the total number of amino groups and imino groups contained in the aminosilane is one, two, and three may be particularly referred to as monoamino silane, diamino silane, and triamino silane, respectively. Monoamino silane and diamino silane can be suitably used in the present invention. In a suitable embodiment, a monoamino silane containing one amino group can be used as aminosilane. In a suitable embodiment, aminosilane may contain at least one, for example, one amino group at a terminal of a molecule, preferably at a terminal of a linear or branched chain molecule.

Examples of the aminosilane can include N-2-(aminoethyl)-3-aminopropylmethyldimethoxysilane, N-2-(aminoethyl)-3-aminopropyltrimethoxysilane, 3-aminopropyltrimethoxysilane, 1-aminopropyltrimethoxysilane, 2-aminopropyltrimethoxysilane, 1,2-diaminopropyltrimethoxysilane, 3-amino-1-propenyl trimethoxysilane, 3-amino-1-propynyl trimethoxysilane, 3-aminopropyltriethoxysilane, 3-triethoxysilyl-N-(1,3-dimethyl-butylidene) propylamine, N-phenyl-3-aminopropyltrimethoxysilane, N-(vinylbenzyl)-2-aminoethyl-3-aminopropyltrimethoxysilane, 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, and 3-(N-phenyl) aminopropyltrimethoxysilane.

Further, in a preferred embodiment, it is preferred to use, for silane coupling treatment, a silane having a structural formula of the following formula I:

$$H_2N-R^1-Si(OR^2)_2(R^3) \text{(Formula I)}$$ (wherein, in the above formula I, R$^1$ is a linear or branched, saturated or unsaturated, substituted or unsubstituted, cyclic or acyclic, C1-C12 hydrocarbon bivalent group having a heterocycle or not having a heterocycle;
R$^2$ is a C1-C5 alkyl group; and
R$^3$ is a C1-C5 alkyl group or a C1-C5 alkoxy group).
R$^1$ is preferably a group selected from the group consisting of a substituted or unsubstituted C1-C12 linear saturated hydrocarbon bivalent group, a substituted or unsubstituted C1-C12 branched saturated hydrocarbon bivalent group, a substituted or unsubstituted C1-C12 linear unsaturated hydrocarbon bivalent group, a substituted or unsubstituted C1-C12 branched unsaturated hydrocarbon bivalent group, a substituted or unsubstituted C1-C12 cyclic hydrocarbon bivalent group, a substituted or unsubstituted C1-C12 heterocyclic hydrocarbon bivalent group, and a substituted or unsubstituted C1-C12 aromatic hydrocarbon bivalent group.

Further, R$^1$ is preferably a group selected from the group consisting of —(CH$_2$)$_n$—, —(CH$_2$)$_n$—(CH)$_m$—(CH$_2$)$_{j-1}$—, —(CH$_2$)$_n$—(CC)—(CH$_2$)$_{n-1}$—, —(CH$_2$)$_n$—NH—(CH$_2$)$_m$—, —(CH$_2$)$_n$—NH—(CH$_2$)$_m$—NH—(CH$_2$)$_j$—, —(CH$_2$)$_{n-1}$—(CH)NH$_2$—(CH$_2$)$_{m-1}$—, and —(CH$_2$)$_{n-1}$—(CH)NH$_2$—(CH$_2$)$_{m-1}$—NH—(CH$_2$)$_j$— (wherein n, m, and j are each an integer of 1 or greater).

R$^1$ is preferably —(CH$_2$)$_n$— or —(CH$_2$)$_n$—NH—(CH$_2$)$_m$—.

It is preferred that n, m, and j be each independently 1, 2, or 3.

R$^2$ is preferably a methyl group or an ethyl group.
R$^3$ is preferably a methyl group, an ethyl group, a methoxy group, or an ethoxy group.

Further, in another embodiment, a layer containing Si and N may be provided on the surface of a copper foil by dry plating such as sputtering, CVD, and PDV.

An example of sputtering conditions will be shown below.
(Target): 15 to 65 mass % of Si; 25 to 55 mass % of N; and the total of the Si concentration and the N concentration is 50 mass % or greater. The balance may be any element.
(Apparatus) Sputtering apparatus manufactured by ULVAC Inc.
(Output) DC 50 W
(Argon pressure) 0.2 Pa

EXAMPLES

Hereinafter, the present invention will be described with reference to Examples. Note that these Examples show only a suitable example, and the present invention is not limited to these Examples. Therefore, all of the modifications and other Examples or embodiments included in the technical idea of the present invention are included in the present invention. Note that Comparative Examples will be described together for comparison with the present invention.

Example 1

An ingot in which 1200 ppm of Sn was added to oxygen-free copper was produced, and the resulting ingot was hot-rolled from 900° C. to obtain a sheet having a thickness of 10 mm. Then, the sheet was repeatedly subjected to cold rolling and annealing and finally cold-rolled to a copper foil having a thickness of 9 μm. The rolled copper foil had a surface roughness Rz of 0.63 μm.

Next, Ni plating was applied to the rolled copper foil under the following conditions (roughening treatment was not performed). Note that the balance of Ni plating solution is water. Further, the balance of a solution used for roughening treatment, plating, silane treatment, heat-resistant treatment, rust-proofing treatment, or the like described in the present application was water unless otherwise stated.
Ni ions: 10 to 40 g/L
Temperature: 30 to 70° C.
Current density: 1 to 9 A/dm$_2$
Plating time: 0.1 to 3.0 seconds
pH: 1.0 to 5.0

Next, immersion chromate treatment was applied to the Ni-plated rolled copper foil under the following conditions.
K$_2$Cr$_2$O$_7$: 1 to 10 g/L
Temperature: 20 to 60° C.
Treatment time: 1 to 5 seconds Next, silane coupling treatment shown in Table 1 was performed.
Type of silane: N-2-(aminoethyl)-3-aminopropyltrimethoxysilane
Silane concentration: 1.5 vol %
Temperature: 10 to 60° C.
Treatment time: 1 to 5 seconds
Drying after silane treatment: 100° C.×3 seconds As a result, copper foil surface roughness Rz (ten-point average roughness) after silane coupling treatment was found to be 0.63 μm. Note that Rz was measured using a contact roughness meter, Surfcorder SE-3C stylus-type roughness tester manufactured by Kosaka Laboratory Ltd. according to JIS B0601-1982. With respect to the amount of adhesion of Si on the copper foil surface, a surface-treated copper foil having a size of 1 dm×1 dm was dissolved with an acid and quantitatively analyzed by ICP (inductively coupled plasma atomic emission spectrometry), thereby determining the mass (μg) of adhering Si per unit area of the surface-treated copper foil. As a result, the amount of adhesion of Si was found to be 3.5 μg/dm². Further, with respect to the amount of adhesion of N on the copper foil surface, a surface-treated copper foil having a size of 1 dm×1 dm was melted at a high temperature; the amount $NO_2$ generated was calculated; and the amount of N attached to the entire surface of the copper foil was measured, thereby determining the mass of adhering N per unit area of the surface-treated copper foil. As a result, the amount of adhesion of N was found to be 4.5 $μg/dm_2$. Note that when Si and N are detected by this measurement, it can be determined that a silane coupling treatment layer with aminosilane is present on the surface-treated copper foil.

Note that when Si and N have adhered also to the surface to which a resin is not bonded, it is necessary to previously remove them or to perform masking or the like so that Si and N may not affect the results of the measurement of a bonding surface with a resin.

Since the measuring methods (evaluation methods) of the mass (μg) of Si adhering to the copper foil surface and the amount of adhesion of N in the following Examples and Comparative Examples have been performed in the same manner, the description of the operation method will be omitted in order to avoid complicatedness.

The above results have satisfied the conditions of the present invention that the amount of adhesion of Si on the copper foil surface is from 3.1 to 300 μg/dm², and the amount of adhesion of N on the copper foil surface is from 2.5 to 690 μg/dm².

The silane-treated rolled copper foil produced in this way was bonded by pressing to a resin of a liquid crystal polymer (Vecstar CT-Z, manufactured by Kuraray Co., Ltd.) having a thickness of 50 μm. The sample obtained in this way was used to measure the 90 degree peel strength.

The peel strength is obtained when the circuit width is set to 3 mm, and the copper foil is peeled from the resin at a rate of 50 mm/min at an angle of 90 degrees. The measurement was performed twice, and the average value was adopted as the peel strength.

The measurement of peel strength is according to JIS C6471-1995 (hereinafter the same). As a result, a 90 degree peel strength of 0.32 kg/cm was obtained. These results are shown in Table 1. As shown in this Example 1, it is found that the surface-treated rolled copper foil of Example 1 has industrially sufficient surface performance as a material for a circuit substrate for high frequency.

Further, after the copper foil is bonded to a liquid crystal polymer having a thickness of 50 μm, a microstrip line structure was formed in order to investigate high frequency characteristics. At this time, the circuit was formed so that characteristic impedance might be 50Ω. Transmission loss was measured using this circuit, and when the transmission loss at a frequency of 30 GHz was smaller than −0.6, the high frequency characteristics were shown as ⊚. Further, when the transmission loss was −0.6 to −0.8, −0.8 to −1.2, and greater than −1.2, the high frequency characteristics were shown as ○, Δ, and ×, respectively. Note that these measured values are shown as a reference and do not limit the range.

TABLE 1

| | Type of silane | Silane concentration (vol %) | 90 degree peel strength (kg/cm) | Copper foil surface roughness Rz after silane coupling treatment (μm) | Amount of adhesion of Si (μg/dm²) | Amount of adhesion of N (μg/dm²) | Amount of adhesion of N/S | High frequency characteristics |
|---|---|---|---|---|---|---|---|---|
| Comparative Example 1 | N-2-(aminoethyl)-3-aminopropyltrimethoxysilane | 0.5 | 0.11 | 0.60 | 1.7 | 3.2 | 1.8 | ⊚ |
| Comparative Example 2 | N-2-(aminoethyl)-3-aminopropyltrimethoxysilane | 1.0 | 0.12 | 0.61 | 2.2 | 3.4 | 1.5 | ⊚ |
| Example 1 | N-2-(aminoethyl)-3-aminopropyltrimethoxysilane | 1.5 | 0.32 | 0.63 | 3.5 | 4.5 | 1.3 | ⊚ |
| Example 2 | N-2-(aminoethyl)-3-aminopropyltrimethoxysilane | 1.7 | 0.48 | 0.61 | 5.8 | 13.0 | 2.2 | ⊚ |
| Example 3 | N-2-(aminoethyl)-3-aminopropyltrimethoxysilane | 2.0 | 0.55 | 0.61 | 10.0 | 20.1 | 2.0 | ⊚ |
| Example 4 | N-2-(aminoethyl)-3-aminopropyltrimethoxysilane | 3.0 | 0.63 | 0.67 | 12.5 | 20.4 | 1.6 | ⊚ |
| Example 5 | N-2-(aminoethyl)-3-aminopropyltrimethoxysilane | 4.0 | 0.63 | 0.65 | 16.8 | 23.0 | 1.4 | ⊚ |
| Example 6 | N-2-(aminoethyl)-3-aminopropyltrimethoxysilane | 5.0 | 0.77 | 0.61 | 24.5 | 36.2 | 1.5 | ⊚ |
| Example 7 | N-2-(aminoethyl)-3-aminopropyltrimethoxysilane | 6.5 | 0.83 | 0.60 | 28.5 | 27.6 | 1.0 | ⊚ |
| Example 8 | N-2-(aminoethyl)-3-aminopropyltrimethoxysilane | 5.0 | 0.95 | 0.90 | 77.3 | 90.3 | 1.2 | ○ |
| Example 9 | N-2-(aminoethyl)-3-aminopropyltrimethoxysilane | 7.5 | 1.13 | 0.92 | 115.0 | 187.2 | 1.6 | ○ |
| Example 10 | N-2-(aminoethyl)-3-aminopropyltrimethoxysilane | 7.5 | 1.31 | 1.48 | 243.5 | 399.3 | 1.6 | Δ |
| Example 11 | N-2-(aminoethyl)-3-aminopropylmethyldimethoxysilane | 5.0 | 0.71 | 0.62 | 33.7 | 77.5 | 2.3 | ⊚ |

TABLE 1-continued

| | Type of silane | Silane concentration (vol %) | 90 degree peel strength (kg/cm) | Copper foil surface roughness Rz after silane coupling treatment (μm) | Amount of adhesion of Si (μg/dm²) | Amount of adhesion of N (μg/dm²) | Amount of adhesion of N/S | High frequency characteristics |
|---|---|---|---|---|---|---|---|---|
| Example 12 | 3-aminopropyltrimethoxysilane | 7.0 | 0.81 | 0.65 | 60.5 | 55.3 | 0.9 | ⊚ |
| Example 13 | 3-triethoxysilyl-N-(1,3-dimethyl-butylidene)propylamine | 5.5 | 0.71 | 0.64 | 25.5 | 28.9 | 1.1 | ⊚ |
| Example 14 | N-phenyl-3-aminopropyltrimethoxysilane | 7.5 | 0.79 | 0.60 | 90.6 | 75.2 | 0.8 | ⊚ |
| Comparative Example 3 | — | — | 0.03 | 0.61 | 0.0 | 0.0 | 0.0 | ⊚ |
| Comparative Example 4 | — | — | 0.32 | 0.92 | 0.0 | 0.0 | 0.0 | ○ |
| Comparative Example 5 | — | — | 0.66 | 1.53 | 0.0 | 0.0 | 0.0 | Δ |
| Comparative Example 6 | — | — | 0.89 | 3.21 | 0.0 | 0.0 | 0.0 | X |
| Comparative Example 7 | N-2-(aminoethyl)-3-aminopropyltrimethoxysilane | 10.0 | — | 1.51 | 343.0 | 879.0 | 2.6 | Δ |
| Comparative Example 8 | Glycidoxypropyltrimethoxysilane | 1.5 | 0.13 | 0.62 | 3.5 | 0.0 | 0.0 | ⊚ |
| Comparative Example 9 | " | 5.0 | 0.19 | 0.63 | 31.2 | 0.0 | 0.0 | ⊚ |
| Comparative Example 10 | 3-methacryloxypropyltrimethoxysilane | 2.0 | 0.04 | 0.67 | 9.3 | 0.0 | 0.0 | ⊚ |
| Comparative Example 11 | Vinyltrimetoxysilane | 0.5 | 0.07 | 0.65 | 2.2 | 0.0 | 0.0 | ⊚ |
| Comparative Example 12 | " | 2.0 | 0.09 | 0.65 | 14.4 | 0.0 | 0.0 | ⊚ |
| Comparative Example 13 | " | 5.0 | 0.11 | 0.65 | 63.1 | 0.0 | 0.0 | ⊚ |
| Comparative Example 14 | 3-mercaptopropyltrimethoxysilane | 2.0 | 0.07 | 0.64 | 9.8 | 0.0 | 0.0 | ⊚ |
| Comparative Example 15 | Tetramethoxysilane | 2.0 | 0.07 | 0.67 | 10.1 | 0.0 | 0.0 | ⊚ |
| Comparative Example 16 | Mixture of tetramethoxysilane and 3-mercaptopropyltrimethoxysilane | 0.2:0.5 | 0.05 | 0.64 | 5.1 | 0.0 | 0.0 | ⊚ |

Example 2

The conditions of silane treatment in Example 1 were changed (silane concentration was set to 1.7 vol %), and other conditions were set to the same as those in Example 1. As a result, the copper foil surface roughness Rz after silane coupling treatment was found to be 0.61 μm.

As a result of determining the mass (μg) of adhering Si in the same manner as in Example 1, the mass of adhering Si was found to be 5.8 μg/dm², and the mass of adhering N was found to be 13.0 μg/dm².

The above results have satisfied the conditions of the present invention that the amount of adhesion of Si on the copper foil surface is from 3.1 to 300 μg/dm², and the amount of adhesion of N on the copper foil surface is from 2.5 to 690 μg/dm². As a result of the foregoing, a 90 degree peel strength of 0.48 kg/cm was obtained.

These are shown in Table 1. As shown in this Example 2, it is found that the surface-treated rolled copper foil of Example 2 has industrially sufficient surface performance as a material for a circuit substrate for high frequency.

Example 3

The conditions of silane treatment in Example 1 were changed (silane concentration was set to 2.0 vol %), and other conditions were set to the same as those in Example 1. As a result, the copper foil surface roughness Rz after silane coupling treatment was found to be 0.61 μm.

As a result of determining the mass (mg) of adhering Si in the same manner as in Example 1, the mass of adhering Si was found to be 10.0 μg/dm², and the mass of adhering N was found to be 20.1 μg/dm².

The above results have satisfied the conditions of the present invention that the amount of adhesion of Si on the copper foil surface is from 3.1 to 300 μg/dm², and the amount of adhesion of N on the copper foil surface is from 2.5 to 690 μg/dm². As a result of the foregoing, a 90 degree peel strength of 0.55 kg/cm was obtained.

These are shown in Table 1. As shown in this Example 3, it is found that the surface-treated rolled copper foil of Example 3 has industrially sufficient surface performance as a material for a circuit substrate for high frequency.

Example 4

The conditions of silane treatment in Example 1 were changed (silane concentration was set to 3.0 vol %), and other conditions were set to the same as those in Example 1. As a result, the copper foil surface roughness Rz after silane coupling treatment was found to be 0.67 μm.

As a result of determining the mass (μg) of adhering Si in the same manner as in Example 1, the mass of adhering Si was found to be 12.5 μg/dm², and the mass of adhering N was found to be 20.4 μg/dm².

The above results have satisfied the conditions of the present invention that the amount of adhesion of Si on the copper foil surface is from 3.1 to 300 μg/dm², and the amount of adhesion of N on the copper foil surface is from 2.5 to 690 μg/dm². As a result of the foregoing, a 90 degree peel strength of 0.63 kg/cm was obtained.

These are shown in Table 1. As shown in this Example 4, it is found that the surface-treated rolled copper foil of Example 4 has industrially sufficient surface performance as a material for a circuit substrate for high frequency.

Example 5

The conditions of silane treatment in Example 1 were changed (silane concentration was set to 4.0 vol %), and other conditions were set to the same as those in Example 1. As a result, the copper foil surface roughness Rz after silane coupling treatment was found to be 0.65 μm.

As a result of determining the mass (mg) of adhering Si in the same manner as in Example 1, the mass of adhering Si was found to be 16.8 μg/dm², and the mass of adhering N was found to be 23.0 μg/dm².

The above results have satisfied the conditions of the present invention that the amount of adhesion of Si on the copper foil surface is from 3.1 to 300 μg/dm², and the amount of adhesion of N on the copper foil surface is from 2.5 to 690 μg/dm². As a result of the foregoing, a 90 degree peel strength of 0.63 kg/cm was obtained.

These are shown in Table 1. As shown in this Example 5, it is found that the surface-treated rolled copper foil of Example 5 has industrially sufficient surface performance as a material for a circuit substrate for high frequency.

Example 6

The conditions of silane treatment in Example 1 were changed (silane concentration was set to 5.0 vol %), and other conditions were set to the same as those in Example 1. As a result, the copper foil surface roughness Rz after silane coupling treatment was found to be 0.61 μm.

As a result of determining the mass (mg) of adhering Si in the same manner as in Example 1, the mass of adhering Si was found to be 24.5 μg/dm², and the mass of adhering N was found to be 36.2 μg/dm².

The above results have satisfied the conditions of the present invention that the amount of adhesion of Si on the copper foil surface is from 3.1 to 300 μg/dm², and the amount of adhesion of N on the copper foil surface is from 2.5 to 690 μg/dm². As a result of the foregoing, a 90 degree peel strength of 0.77 kg/cm was obtained.

These are shown in Table 1. As shown in this Example 6, it is found that the surface-treated rolled copper foil of Example 6 has industrially sufficient surface performance as a material for a circuit substrate for high frequency.

Example 7

The conditions of silane treatment in Example 1 were changed (silane concentration was set to 6.5 vol %), and other conditions were set to the same as those in Example 1. As a result, the copper foil surface roughness Rz after silane coupling treatment was found to be 0.60 μm.

As a result of determining the mass (μg) of adhering Si in the same manner as in Example 1, the mass of adhering Si was found to be 28.5 μg/dm², and the mass of adhering N was found to be 27.6 μg/dm².

The above results have satisfied the conditions of the present invention that the amount of adhesion of Si on the copper foil surface is from 3.1 to 300 μg/dm², and the amount of adhesion of N on the copper foil surface is from 2.5 to 690 μg/dm². As a result of the foregoing, a 90 degree peel strength of 0.83 kg/cm was obtained.

These are shown in Table 1. As shown in this Example 7, it is found that the surface-treated rolled copper foil of Example 7 has industrially sufficient surface performance as a material for a circuit substrate for high frequency.

Example 8

Before the nickel plating in Example 1, roughening treatment was performed followed by heat-resistant and rust-proofing treatment, and further, conditions of silane treatment was changed (silane concentration was set to 5.0 vol %). Other conditions were set to the same as those in Example 1. (That is, roughening treatment, heat-resistant and rust-proofing treatment, immersion chromate treatment, and silane treatment were applied to the rolled copper foil of Example 1 which was cold-rolled to a thickness of 9 mm. Nickel plating was not performed.)

As a result, the copper foil surface roughness Rz after silane coupling treatment was found to be 0.90 μm. An example of roughening treatment conditions is given below. Note that in this Example, roughening treatment (plating for roughening treatment) was performed under the following plating conditions. Note that these plating conditions show just a suitable example, and there will be no problem even if plating conditions are other than those to be described below.

(Plating Conditions of Copper Primary Particles)
Solution composition: 10 to 20 g/L of copper, 50 to 100 g/L of sulfuric acid
Solution temperature: 25 to 50° C.
Current density: 1 to 58 A/dm²
Plating time: 0.1 to 10 seconds
(Plating Conditions of Secondary Particles)
Solution composition: 10 to 20 g/L of copper, 5 to 15 g/L of nickel, 5 to 15 g/L of cobalt
pH: 2 to 3
Solution temperature: 30 to 50° C.
Current density: 24 to 50 A/dm²
Plating time: 0.5 to 4 seconds As a result of determining the mass (μg) of adhering Si in the same manner as in Example 1, the mass of adhering Si was found to be 77.3 μg/dm², and the mass of adhering N was found to be 90.3 μg/dm².

The above results have satisfied the conditions of the present invention that the amount of adhesion of Si on the copper foil surface is from 3.1 to 300 μg/dm², and the amount of adhesion of N on the copper foil surface is from 2.5 to 690 μg/dm². As a result of the foregoing, a 90 degree peel strength of 0.95 kg/cm was obtained.

These are shown in Table 1. As shown in this Example 8, it is found that the surface-treated rolled copper foil of Example 8 has industrially sufficient surface performance as a material for a circuit substrate for high frequency.

Example 9

Before the nickel plating in Example 1, roughening treatment was performed followed by heat-resistant and rust-proofing treatment, and further, conditions of silane treatment was changed (silane concentration was set to 7.5 vol %). (That is, roughening treatment, heat-resistant and rust-proofing treatment, immersion chromate treatment, and silane treatment were applied to the rolled copper foil of Example 1 which was cold-rolled to a thickness of 9 μm. Nickel plating was not performed.) Other conditions were set to the same as those in Example 1. As a result, the copper foil surface roughness Rz after silane coupling treatment was found to be 0.92 µm. Note that in this Example, roughening treatment (plating for roughening treatment) was performed under the same plating conditions as in Example 8.

As a result of determining the mass (µg) of adhering Si in the same manner as in Example 1, the mass of adhering Si was found to be 115.0 µg/dm$^2$, and the mass of adhering N was found to be 187.2 µg/dm$^2$.

The above results have satisfied the conditions of the present invention that the amount of adhesion of Si on the copper foil surface is from 3.1 to 300 µg/dm$^2$, and the amount of adhesion of N on the copper foil surface is from 2.5 to 690 µg/dm$^2$. As a result of the foregoing, a 90 degree peel strength of 1.13 kg/cm was obtained.

These are shown in Table 1. As shown in this Example 9, it is found that the surface-treated rolled copper foil of Example 9 has industrially sufficient surface performance as a material for a circuit substrate for high frequency.

Example 10

Before the nickel plating in Example 1, roughening treatment was performed followed by heat-resistant and rust-proofing treatment, and further, conditions of silane treatment were changed (silane concentration was set to 7.5 vol %). Other conditions were set to the same as those in Example 1. (That is, roughening treatment, heat-resistant and rust-proofing treatment, immersion chromate treatment, and silane treatment were applied to the rolled copper foil of Example 1 which was cold-rolled to a thickness of 9 mm. Nickel plating was not performed.) As a result, the copper foil surface roughness Rz after silane coupling treatment was found to be 1.48 µm.

As a result of determining the mass (µg) of adhering Si in the same manner as in Example 1, the mass of adhering Si was found to be 243.5 µg/dm$^2$, and the mass of adhering N was found to be 399.3 µg/dm$^2$.

The above results have satisfied the conditions of the present invention that the amount of adhesion of Si on the copper foil surface is from 3.1 to 300 µg/dm$^2$, and the amount of adhesion of N on the copper foil surface is from 2.5 to 690 µg/dm$^2$. As a result of the foregoing, a 90 degree peel strength of 1.31 kg/cm was obtained. These are shown in Table 1. As shown in this Example 10, it is found that the surface-treated rolled copper foil of Example 10 has industrially sufficient surface performance as a material for a circuit substrate for high frequency.

Example 11

The type of silane and the conditions of silane treatment in Example 1 were changed (N-2-aminoethyl-3-aminopropylmethyldimethoxysilane was used, and silane concentration was set to 5.0 vol %), and other conditions were set to the same as those in Example 1. As a result, the copper foil surface roughness Rz after silane coupling treatment was found to be 0.62 µm.

As a result of determining the mass (µg) of adhering Si in the same manner as in Example 1, the mass of adhering Si was found to be 33.7 µg/dm$^2$, and the mass of adhering N was found to be 77.5 µg/dm$^2$.

The above results have satisfied the conditions of the present invention that the amount of adhesion of Si on the copper foil surface is from 3.1 to 300 µg/dm$^2$, and the amount of adhesion of N on the copper foil surface is from 2.5 to 690 µg/dm$^2$. As a result of the foregoing, a 90 degree peel strength of 0.71 kg/cm was obtained.

These are shown in Table 1. As shown in this Example 11, it is found that the surface-treated rolled copper foil of Example 11 has industrially sufficient surface performance as a material for a circuit substrate for high frequency.

Example 12

The type of silane and the conditions of silane treatment in Example 1 were changed (3-aminopropylmethoxysilane was used, and silane concentration was set to 7.0 vol %), and other conditions were set to the same as those in Example 1. As a result, the copper foil surface roughness Rz after silane coupling treatment was found to be 0.65 mm.

As a result of determining the mass (µg) of adhering Si in the same manner as in Example 1, the mass of adhering Si was found to be 60.5 µg/dm$^2$, and the mass of adhering N was found to be 55.3 µg/dm$^2$.

The above results have satisfied the conditions of the present invention that the amount of adhesion of Si on the copper foil surface is from 3.1 to 300 µg/dm$^2$, and the amount of adhesion of N on the copper foil surface is from 2.5 to 690 µg/dm$^2$. As a result of the foregoing, a 90 degree peel strength of 0.81 kg/cm was obtained.

These are shown in Table 1. As shown in this Example 12, it is found that the surface-treated rolled copper foil of Example 12 has industrially sufficient surface performance as a material for a circuit substrate for high frequency.

Example 13

The type of silane and the conditions of silane treatment in Example 1 were changed (3-triethoxysilyl-N-1,3-dimethyl-butylidene propylamine was used, and silane concentration was set to 5.5 vol %), and other conditions were set to the same as those in Example 1. As a result, the copper foil surface roughness Rz after silane coupling treatment was found to be 0.64 µm.

As a result of determining the mass (µg) of adhering Si in the same manner as in Example 1, the mass of adhering Si was found to be 25.5 µg/dm$^2$, and the mass of adhering N was found to be 28.9 µg/dm$^2$.

The above results have satisfied the conditions of the present invention that the amount of adhesion of Si on the copper foil surface is from 3.1 to 300 µg/dm$^2$, and the amount of adhesion of N on the copper foil surface is from 2.5 to 690 µg/dm$^2$. As a result of the foregoing, a 90 degree peel strength of 0.71 kg/cm was obtained.

These are shown in Table 1. As shown in this Example 13, it is found that the surface-treated rolled copper foil of Example 13 has industrially sufficient surface performance as a material for a circuit substrate for high frequency.

Example 14

The type of silane and the conditions of silane treatment in Example 1 were changed (N-phenyl-3-aminopropylmethoxysilane was used, and silane concentration was set to 7.5 vol %), and other conditions were set to the same as those in Example 1. As a result, the copper foil surface roughness Rz after silane coupling treatment was found to be 0.60 mm.

As a result of determining the mass (µg) of adhering Si in the same manner as in Example 1, the mass of adhering Si was found to be 90.6 µg/dm$^2$, and the mass of adhering N was found to be 75.2 µg/dm$^2$.

The above results have satisfied the conditions of the present invention that the amount of adhesion of Si on the copper foil surface is from 3.1 to 300 μg/dm², and the amount of adhesion of N on the copper foil surface is from 2.5 to 690 μg/dm². As a result of the foregoing, a 90 degree peel strength of 0.79 kg/cm was obtained.

These are shown in Table 1. As shown in this Example 14, it is found that the surface-treated rolled copper foil of Example 14 has industrially sufficient surface performance as a material for a circuit substrate for high frequency.

Comparative Example 1

The conditions of silane treatment in Example 1 were changed (silane concentration was set to 0.5 vol %), and 90 degree peel strength was measured in the same manner. Other conditions were set to the same as those in Example 1. As a result, the copper foil surface roughness Rz after silane coupling treatment was found to be 0.60 mm.

As a result of determining the mass (μg) of adhering Si in the same manner as in Example 1, the mass of adhering Si was found to be 1.7 μg/dm², and the mass of adhering N was found to be 3.2 μg/dm².

The above results did not satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, the 90 degree peel strength was as low as 0.11 kg/cm. These are shown in Table 1. As shown in this Comparative Example 1, the surface-treated rolled copper foil of Comparative Example 1 could not have industrially sufficient surface performance as a material for a circuit substrate for high frequency.

Comparative Example 2

The conditions of silane treatment in Example 1 were changed (silane concentration was set to 1.0 vol %), and 90 degree peel strength was measured in the same manner. Other conditions were set to the same as those in Example 1. As a result, the copper foil surface roughness Rz after silane coupling treatment was found to be 0.61 μm.

As a result of determining the mass (μg) of adhering Si in the same manner as in Example 1, the mass of adhering Si was found to be 2.2 μg/dm², and the mass of adhering N was found to be 3.4 μg/dm². The above results did not satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, the 90 degree peel strength was as low as 0.12 kg/cm. These are shown in Table 1. As shown in this Comparative Example 2, the surface-treated rolled copper foil of Comparative Example 2 could not have industrially sufficient surface performance as a material for a circuit substrate for high frequency.

Comparative Example 3

The silane treatment in Example 1 was not performed. Therefore, neither Si nor N is present on the copper foil surface. Then, 90 degree peel strength was measured in the same manner. Other conditions were set to the same as those in Example 1. As a result, the copper foil surface roughness Rz after silane coupling treatment was found to be 0.61 μm.

Neither Si nor N is present on the copper foil surface, which did not satisfied the conditions of the present invention that the amount of adhesion of N on the copper foil surface of the present invention is from 2.5 to 690 μg/dm².

As a result of the foregoing, the 90 degree peel strength was as remarkably low as 0.03 kg/cm. These are shown in Table 1. As shown in this Comparative Example 3, the rolled copper foil of Comparative Example 3 in which neither Si nor N is present on the copper foil surface could not have industrially sufficient surface performance as a material for a circuit substrate for high frequency.

Comparative Example 4

Before the nickel plating in Example 1, roughening treatment was performed followed by heat-resistant and rust-proofing treatment, but silane treatment was not performed. (That is, roughening treatment, heat-resistant and rust-proofing treatment, and immersion chromate treatment were applied to the rolled copper foil of Example 1 which was cold-rolled to a thickness of 9 μm. Nickel plating was not performed.) Therefore, neither Si nor N is present on the copper foil surface. Then, 90 degree peel strength was measured in the same manner. Other conditions were set to the same as those in Example 1. As a result, the copper foil surface roughness Rz after silane coupling treatment was found to be 0.92 μm. Note that in this Example, roughening treatment (plating for roughening treatment) was performed under the same plating conditions as in Example 8.

Neither Si nor N is present on the copper foil surface, which did not satisfied the conditions of the present invention that the amount of adhesion of N on the copper foil surface of the present invention is from 2.5 to 690 μg/dm².

As a result of the foregoing, the 90 degree peel strength was as low as 0.32 kg/cm. These are shown in Table 1. As compared with Examples 8 and 9, the rolled copper foil in which neither Si nor N is present on the copper foil surface could not have industrially sufficient surface performance as a material for a circuit substrate for high frequency.

Comparative Example 5

Before the nickel plating in Example 1, roughening treatment was performed followed by heat-resistant and rust-proofing treatment, but silane treatment was not performed. (That is, roughening treatment, heat-resistant and rust-proofing treatment, and immersion chromate treatment were applied to the rolled copper foil of Example 1 which was cold-rolled to a thickness of 9 μm. Nickel plating was not performed.) Therefore, neither Si nor N is present on the copper foil surface. Then, 90 degree peel strength was measured in the same manner. Other conditions were set to the same as those in Example 1. As a result, the copper foil surface roughness Rz after silane coupling treatment was found to be 1.53 μm. Note that in this Example, roughening treatment (plating for roughening treatment) was performed under the same plating conditions as in Example 10.

Neither Si nor N is present on the copper foil surface, which did not satisfied the conditions of the present invention that the amount of adhesion of N on the copper foil surface of the present invention is from 2.5 to 690 μg/dm².

As a result of the foregoing, the 90 degree peel strength was found to be 0.66 kg/cm. These are shown in Table 1. As compared with Example 10, it was not able to say that the rolled copper foil in which neither Si nor N is present on the copper foil surface had an industrially optimum surface performance as a material for a circuit substrate for high frequency.

Comparative Example 6

Before the nickel plating in Example 1, roughening treatment was performed followed by heat-resistant and rust-proofing treatment, but silane treatment was not performed. (That is, roughening treatment, heat-resistant and rust-proofing treatment, and immersion chromate treatment were applied to the rolled copper foil of Example 1 which was cold-rolled to a thickness of 9 mm. Nickel plating was not performed.) Therefore, neither Si nor N is present on the copper foil surface. Then, 90 degree peel strength was measured in the same manner. Other conditions were set to the same as those in Example 1. As a result, the copper foil surface roughness Rz after silane coupling treatment was found to be 3.21 μm.

Neither Si nor N is present on the copper foil surface, which did not satisfied the conditions of the present invention that the amount of adhesion of N on the copper foil surface of the present invention is from 2.5 to 690 μg/dm².

As a result of the foregoing, the 90 degree peel strength was found to be 0.89 kg/cm. These are shown in Table 1. This copper foil has high peel strength compared with the peel strength in other Comparative Examples, which is a physical effect due to coarse surface roughness. However, since loss will be increased by a skin effect if roughness is large as described above, it was not able to say that this copper foil had an industrially optimum surface performance as a material for a circuit substrate for high frequency.

Comparative Example 7

Before the nickel plating in Example 1, roughening treatment was performed followed by heat-resistant and rust-proofing treatment, and further, conditions of silane treatment was changed (silane concentration was set to 10.0 vol %). Other conditions were set to the same as those in Example 1. (That is, roughening treatment, heat resistant and rust-proofing treatment, immersion chromate treatment, and silane treatment were applied to the rolled copper foil of Example 1 which was cold-rolled to a thickness of 9 μm. Nickel plating was not performed.) As a result, the copper foil surface roughness Rz after silane coupling treatment was found to be 1.51 μm. Note that in this Example, roughening treatment (plating for roughening treatment) was performed under the same plating conditions as in Example 10.

As a result of determining the mass (μg) of adhering Si and the mass of adhering N in the same manner as in Example 1, the mass of adhering Si was found to be 343.0 μg/dm², and the mass of adhering N was found to be 879.0 μg/dm².

The above results did not satisfied the conditions of the present invention that the amount of adhesion of Si on the copper foil surface is from 3.1 to 300 μg/dm², and the amount of adhesion of N on the copper foil surface is from 2.5 to 690 μg/dm². Furthermore, foaming occurred when the copper foil was laminated to a liquid crystal polymer (LCP). Therefore, this copper foil was not measured for peel strength.

These are shown in Table 1. As shown in this Comparative Example 7, the surface-treated rolled copper foil of Comparative Example 7 could not have industrially sufficient surface performance as a material for a circuit substrate for high frequency.

Comparative Example 8

The conditions of silane treatment in Example 1 were changed (glycidoxypropyltrimethoxysilane was used, and the concentration was set to 1.5 vol %), and other conditions were set to the same as those in Example 1. As a result, the copper foil surface roughness Rz after silane coupling treatment was found to be 0.62 μm.

As a result of determining the mass (μg) of adhering Si and the mass of adhering N in the same manner as in Example 1, the mass of adhering Si was found to be 3.5 μg/dm², and the mass of adhering N was found to be 0.0 μg/dm². The above results did not satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, the 90 degree peel strength was as low as 0.13 kg/cm. These are shown in Table 1. As shown in this Comparative Example 8, the surface-treated rolled copper foil of Comparative Example 8 could not have industrially sufficient surface performance as a material for a circuit substrate for high frequency.

Comparative Example 9

The conditions of silane treatment in Example 1 were changed (glycidoxypropyltrimethoxysilane was used, and the concentration was set to 5.0 vol %), and other conditions were set to the same as those in Example 1. As a result, the copper foil surface roughness Rz after silane coupling treatment was found to be 0.63 μm.

As a result of determining the mass (μg) of adhering Si and the mass of adhering N in the same manner as in Example 1, the mass of adhering Si was found to be 31.2 μg/dm², and the mass of adhering N was found to be 0.0 μg/dm². The above results did not satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, the 90 degree peel strength was as low as 0.19 kg/cm. These are shown in Table 1. As shown in this Comparative Example 9, the surface-treated rolled copper foil of Comparative Example 9 could not have industrially sufficient surface performance as a material for a circuit substrate for high frequency.

Comparative Example 10

The conditions of silane treatment in Example 1 were changed (3-methacryloxypropyltrimethoxysilane was used, and the concentration was set to 2.0 vol %), and other conditions were set to the same as those in Example 1. As a result, the copper foil surface roughness Rz after silane coupling treatment was found to be 0.67 μm.

As a result of determining the mass (μg) of adhering Si in the same manner as in Example 1, the mass of adhering Si was found to be 9.3 μg/dm², and the mass of adhering N was found to be 0.0 μg/dm². The above results did not satisfied the conditions of the present invention that the amount of adhesion of Si on the copper foil surface is from 3.1 to 300

μg/dm², and the amount of adhesion of N on the copper foil surface is from 2.5 to 690 μg/dm².

As a result of the foregoing, the 90 degree peel strength was as remarkably low as 0.04 kg/cm. These are shown in Table 1. As shown in this Comparative Example 10, the surface-treated rolled copper foil of Comparative Example 10 could not have industrially sufficient surface performance as a material for a circuit substrate for high frequency.

Comparative Example 11

The conditions of silane treatment in Example 1 were changed (vinyltrimetoxysilane was used, and the concentration was set to 0.5 vol %), and other conditions were set to the same as those in Example 1. As a result, the copper foil surface roughness Rz after silane coupling treatment was found to be 0.65 μm.

As a result of determining the mass (μg) of adhering Si in the same manner as in Example 1, the mass of adhering Si was found to be 2.2 μg/dm², and the mass of adhering N was found to be 0.0 μg/dm². The above results did not satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, the 90 degree peel strength was as remarkably low as 0.07 kg/cm. These are shown in Table 1. As shown in this Comparative Example 11, the surface-treated rolled copper foil of Comparative Example 11 could not have industrially sufficient surface performance as a material for a circuit substrate for high frequency.

Comparative Example 12

The conditions of silane treatment in Example 1 were changed (vinyltrimetoxysilane was used, and the concentration was set to 2.0 vol %), and other conditions were set to the same as those in Example 1. As a result, the copper foil surface roughness Rz after silane coupling treatment was found to be 0.65 μm.

As a result of determining the mass (μg) of adhering Si in the same manner as in Example 1, the mass of adhering Si was found to be 14.4 μg/dm², and the mass of adhering N was found to be 0.0 μg/dm². The above results did not satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, the 90 degree peel strength was as remarkably low as 0.09 kg/cm. These are shown in Table 1. As shown in this Comparative Example 12, the surface-treated rolled copper foil of Comparative Example 12 could not have industrially sufficient surface performance as a material for a circuit substrate for high frequency.

Comparative Example 13

The conditions of silane treatment in Example 1 were changed (vinyltrimetoxysilane was used, and the concentration was set to 5.0 vol %), and other conditions were set to the same as those in Example 1. As a result, the copper foil surface roughness Rz after silane coupling treatment was found to be 0.65 mm.

As a result of determining the mass (μg) of adhering Si in the same manner as in Example 1, the mass of adhering Si was found to be 63.1 μg/dm², and the mass of adhering N was found to be 0.0 μg/dm². The above results did not satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, the 90 degree peel strength was as remarkably low as 0.11 kg/cm. These are shown in Table 1. As shown in this Comparative Example 13, the surface-treated rolled copper foil of Comparative Example 13 could not have industrially sufficient surface performance as a material for a circuit substrate for high frequency.

Comparative Example 14

The conditions of silane treatment in Example 1 were changed (3-mercaptopropyltrimethoxysilane was used, and the concentration was set to 2.0 vol %), and other conditions were set to the same as those in Example 1. As a result, the copper foil surface roughness Rz after silane coupling treatment was found to be 0.64 μm.

As a result of determining the mass (μg) of adhering Si in the same manner as in Example 1, the mass of adhering Si was found to be 9.8 μg/dm², and the mass of adhering N was found to be 0.0 μg/dm². The above results did not satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, the 90 degree peel strength was as remarkably low as 0.07 kg/cm. These are shown in Table 1. As shown in this Comparative Example 14, the surface-treated rolled copper foil of Comparative Example 14 could not have industrially sufficient surface performance as a material for a circuit substrate for high frequency.

Comparative Example 15

The conditions of silane treatment in Example 1 were changed (tetramethoxysilane was used, and the concentration was set to 2.0 vol %), and other conditions were set to the same as those in Example 1. As a result, the copper foil surface roughness Rz after silane coupling treatment was found to be 0.67 μm.

As a result of determining the mass (μg) of adhering Si in the same manner as in Example 1, the mass of adhering Si was found to be 10.1 μg/dm², and the mass of adhering N was found to be 0.0 μg/dm². The above results did not satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, the 90 degree peel strength was as remarkably low as 0.07 kg/cm. These are shown in Table 1. As shown in this Comparative Example 15, the surface-treated rolled copper foil of Comparative Example 15 could not have industrially sufficient surface performance as a material for a circuit substrate for high frequency.

Comparative Example 16

The conditions of silane treatment in Example 1 were changed (a mixture of tetramethoxysilane and 3-mercaptopropyltrimethoxysilane was used, and the concentration was set to 0.2+0.5 vol %), and other conditions were set to the same as those in Example 1. As a result, the copper foil surface roughness Rz after silane coupling treatment was found to be 0.64 μm.

As a result of determining the mass (μg) of adhering Si in the same manner as in Example 1, the mass of adhering Si was found to be 5.1 μg/dm², and the mass of adhering N was found to be 0.0 μg/dm². The above results did not satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, the 90 degree peel strength was as remarkably low as 0.05 kg/cm. These are shown in Table 1. As shown in this Comparative Example 16, the surface-treated rolled copper foil of Comparative Example 16 could not have industrially sufficient surface performance as a material for a circuit substrate for high frequency.

Next, examples in the case of changing the type of copper foil, roughening treatment, heat-resistant treatment, and rust-proofing treatment will be shown. These examples include examples in which heat-resistant treatment and/or rust-proofing treatment is not performed (Examples 28, 29, 31 to 33). In this case, N-2-(aminoethyl)-3-aminopropyltrimethoxysilane was used as a silane, and silane concentration was set to 5.0 vol %. Drying after silane treatment was all set to 100° C.×3 seconds. Note that any metal species may be applied to heat-resistant treatment as long as heat resistance is secured when copper foil is laminated to a liquid crystal polymer (LCP). Examples include plating of an element such as Zn, Ni, Co, Mo, P, Cr, and W or plating of an alloy thereof. Note that the heat-resistant treatment layer may not contain Zn.

The production conditions and the method for evaluation (of peel strength) in Example 21 to Example 33 and Comparative Example 21 to Comparative Example 27 are the same as those in Example 1 except that these are each separately described. Note that the treatment conditions of Ni—Co plating treatment, Zn—Ni plating treatment, Ni—Mo plating treatment, Cu—Zn plating treatment, electrolytic chromate treatment, and immersion chromate treatment were as described above. Note that the conditions of immersion chromate treatment were set to the same conditions as in Example 1.

Example 21

A rolled copper foil having a thickness of 6 mm was subjected to roughening treatment and subjected to Ni—Co plating treatment as heat-resistant treatment. Further, electrolytic chromate treatment was performed as rust-proofing treatment. Furthermore, silane treatment was performed on the rust-proofing treatment layer. Silane concentration was set to 5.0 vol %. Other conditions were set to the same as those in Example 1. As a result, the copper foil surface roughness Rz after silane coupling treatment was found to be 0.82 μm. These treatment conditions are shown in Table 2.

TABLE 2

|  | Base material | Thickness (μm) | Rust-proofing treatment | Chromate | Silane concentration (vol %) |
|---|---|---|---|---|---|
| Example 21 | Rolled copper foil | 6 | Ni—Co plating | Electrolytic chromate | 5.0 |
| Example 22 | Rolled copper foil | 12 | Zn—Ni plating | Immersion chromate | 5.0 |
| Example 23 | Rolled copper foil | 35 | Ni—Mo plating | Immersion chromate | 5.0 |
| Example 24 | Rolled copper foil | 18 | Cu—Zn plating | Electrolytic chromate | 5.0 |
| Example 25 | Electrolytic copper foil | 18 | Ni—Co plating | Electrolytic chromate | 5.0 |
| Example 26 | Electrolytic copper foil | 5 | Zn—Ni plating | Immersion chromate | 5.0 |
| Example 27 | Electrolytic copper foil | 12 | Ni—Mo plating | Immersion chromate | 5.0 |
| Example 28 | Rolled copper foil | 9 | — | — | 5.0 |
| Example 29 | Rolled copper foil | 9 | — | Electrolytic chromate | 5.0 |
| Example 30 | Rolled copper foil | 9 | Ni—Co plating | Electrolytic chromate | 5.0 |
| Example 31 | Rolled copper foil | 12 | — | Electrolytic chromate | 5.0 |
| Example 32 | Rolled copper foil | 12 | — | — | 5.0 |
| Example 33 | Rolled copper foil | 12 | — | — | — |
| Comparative Example 21 | Rolled copper foil | 6 | Ni—Co plating | Electrolytic chromate | 0.5 |
| Comparative Example 22 | Rolled copper foil | 12 | Zn—Ni plating | Immersion chromate | 0.5 |
| Comparative Example 23 | Rolled copper foil | 35 | Ni—Mo plating | Immersion chromate | 0.5 |
| Comparative Example 24 | Rolled copper foil | 18 | Cu—Zn plating | Electrolytic chromate | 0.5 |
| Comparative Example 25 | Electrolytic copper foil | 18 | Ni—Co plating | Electrolytic chromate | 0.5 |
| Comparative Example 26 | Electrolytic copper foil | 5 | Zn—Ni plating | Immersion chromate | 0.5 |
| Comparative Example 27 | Electrolytic copper foil | 12 | Ni—Mo plating | Immersion chromate | 0.5 |

TABLE 2-continued

|  | Base material | Thickness (μm) | Rust-proofing treatment | Chromate | Silane concentration (vol %) |
|---|---|---|---|---|---|
| Comparative Example 28 | Electrolytic copper foil | 12 | Ni—Zn plating | Electrolytic chromate | 0.5 |
| Comparative Example 29 | Electrolytic copper foil | 12 | Ni—Zn plating | Immersion chromate | 0.5 |

As a result of determining the mass (μg) of adhering Si and the mass of adhering N in the same manner as in Example 1, the mass of adhering Si was found to be 60.5 μg/dm$^2$, and the mass of adhering N was found to be 77.5 μg/dm$^2$. The above results have satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$.

As a result of the foregoing, a high value of 0.88 kg/cm was obtained as the 90 degree peel strength. These results are shown in Table 3. As shown in this Example 21, it is found that the surface-treated rolled copper foil of Example 21 has industrially sufficient surface performance as a material for a circuit substrate for high frequency.

immersion chromate treatment was performed as rust-proofing treatment. Furthermore, silane treatment was performed on the rust-proofing treatment layer. Silane concentration was set to 5.0 vol %.

Other conditions were set to the same as those in Example 1. As a result, the copper foil surface roughness Rz after silane coupling treatment was found to be 0.90 mm. These treatment conditions are shown in Table 2.

As a result of determining the mass (μg) of adhering Si in the same manner as in Example 1, the mass of adhering Si was found to be 75.2 μg/dm$^2$, and the mass of adhering N was found to be 94.6 μg/dm$^2$. The above results have satisfied the conditions of the present invention that the amount of adhesion of Si on the copper foil surface is from

TABLE 3

|  | 90-degree peel strength (kg/cm) | Copper foil surface roughness Rz after silane coupling treatment (μm) | Amount of adhesion of Si (μg/dm$^2$) | Amount of adhesion of N (μg/dm$^2$) | Amount of adhesion of N/S | High frequency characteristics |
|---|---|---|---|---|---|---|
| Example 21 | 0.88 | 0.82 | 60.5 | 77.5 | 1.3 | ⊚ |
| Example 22 | 0.93 | 0.90 | 75.2 | 94.6 | 1.3 | ○ |
| Example 23 | 1.30 | 1.55 | 90.1 | 109.2 | 1.2 | Δ |
| Example 24 | 0.85 | 0.81 | 43.5 | 54.9 | 1.3 | ⊚ |
| Example 25 | 1.29 | 1.62 | 76.9 | 93.2 | 1.2 | Δ |
| Example 26 | 1.01 | 1.31 | 50.6 | 60.9 | 1.2 | Δ |
| Example 27 | 1.18 | 1.42 | 55.5 | 64.7 | 1.2 | Δ |
| Example 28 | 0.95 | 0.91 | 75.3 | 89.3 | 1.2 | ○ |
| Example 29 | 0.96 | 0.91 | 76.2 | 88.5 | 1.2 | ○ |
| Example 30 | 0.96 | 0.90 | 77.0 | 90.1 | 1.2 | ○ |
| Example 31 | 0.67 | 0.62 | 76.1 | 89.0 | 1.2 | ⊚ |
| Example 32 | 0.61 | 0.31 | 75.6 | 88.9 | 1.2 | ⊚ |
| Example 33 | 0.65 | 0.30 | 90.6 | 60.4 | 0.7 | ⊚ |
| Comparative Example 21 | 0.29 | 0.82 | 0.7 | 0.9 | 1.3 | ⊚ |
| Comparative Example 22 | 0.32 | 0.90 | 0.8 | 1.1 | 1.4 | ○ |
| Comparative Example 23 | 0.70 | 1.55 | 1.5 | 1.5 | 1.0 | Δ |
| Comparative Example 24 | 0.30 | 0.81 | 0.9 | 1.3 | 1.4 | ⊚ |
| Comparative Example 25 | 0.65 | 1.62 | 1.9 | 1.7 | 0.9 | Δ |
| Comparative Example 26 | 0.44 | 1.31 | 1.7 | 2.1 | 1.2 | Δ |
| Comparative Example 27 | 0.45 | 1.42 | 1.9 | 2.0 | 1.1 | Δ |
| Comparative Example 28 | 0.10 | 0.60 | 1.1 | 1.4 | 1.3 | ○ |
| Comparative Example 29 | 0.11 | 0.61 | 1.4 | 1.7 | 1.2 | ○ |

Example 22

A rolled copper foil having a thickness of 12 μm was subjected to roughening treatment and subjected to Zn—Ni plating treatment as heat-resistant treatment. Further, 3.1 to 300 μg/dm$^2$, and the amount of adhesion of N on the copper foil surface is from 2.5 to 690 μg/dm$^2$.

As a result of the foregoing, a high value of 0.93 kg/cm was obtained as the 90 degree peel strength. These results are shown in Table 3. As shown in this Example 22, it is found that the surface-treated rolled copper foil of Example 22 has industrially sufficient surface performance as a material for a circuit substrate for high frequency.

Example 23

A rolled copper foil having a thickness of 35 mm was subjected to roughening treatment and subjected to Ni—Mo plating treatment as heat-resistant treatment. Further, immersion chromate treatment was performed as rust-proofing treatment. Furthermore, silane treatment was performed on the rust-proofing treatment layer. Silane concentration was set to 5.0 vol %.

Other conditions were set to the same as those in Example 1. As a result, the copper foil surface roughness Rz after silane coupling treatment was found to be 1.55 mm. These treatment conditions are shown in Table 2.

As a result of determining the mass (μg) of adhering Si in the same manner as in Example 1, the mass of adhering Si was found to be 90.1 μg/dm², and the mass of adhering N was found to be 109.2 μg/dm². The above results have satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, a high value of 1.30 kg/cm was obtained as the 90 degree peel strength. These results are shown in Table 3. As shown in this Example 23, it is found that the surface-treated rolled copper foil of Example 23 has industrially sufficient surface performance as a material for a circuit substrate for high frequency.

Example 24

A rolled copper foil having a thickness of 18 mm was subjected to roughening treatment and subjected to Cu—Zn plating treatment as heat-resistant treatment. Further, electrolytic chromate treatment was performed as rust-proofing treatment. Furthermore, silane treatment was performed on the rust-proofing treatment layer. Silane concentration was set to 5.0 vol %.

Other conditions were set to the same as those in Example 1. As a result, the copper foil surface roughness Rz after silane coupling treatment was found to be 0.81 mm. These treatment conditions are shown in Table 2.

As a result of determining the mass (μg) of adhering Si in the same manner as in Example 1, the mass of adhering Si was found to be 43.5 μg/dm², and the mass of adhering N was found to be 54.9 μg/dm². The above results have satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, a high value of 0.85 kg/cm was obtained as the 90 degree peel strength. These results are shown in Table 3. As shown in this Example 24, it is found that the surface-treated rolled copper foil of Example 24 has industrially sufficient surface performance as a material for a circuit substrate for high frequency.

Example 25

A glossy surface of an electrolytic copper foil having a thickness of 18 mm was subjected to roughening treatment and subjected to Ni—Co plating treatment as heat-resistant treatment. Further, electrolytic chromate treatment was performed as rust-proofing treatment. Furthermore, silane treatment was performed on the rust-proofing treatment layer. Silane concentration was set to 5.0 vol %.

Other conditions were set to the same as those in Example 1. As a result, the copper foil surface roughness Rz after silane coupling treatment was found to be 1.62 mm. These treatment conditions are shown in Table 2.

As a result of determining the mass (μg) of adhering Si in the same manner as in Example 1, the mass of adhering Si was found to be 76.9 μg/dm², and the mass of adhering N was found to be 93.2 μg/dm². The above results have satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, a high value of 1.29 kg/cm was obtained as the 90 degree peel strength. These results are shown in Table 3. As shown in this Example 25, it is found that the surface-treated electrolytic copper foil of Example 25 has industrially sufficient surface performance as a material for a circuit substrate for high frequency.

Example 26

A glossy surface of an electrolytic copper foil having a thickness of 5 μm was subjected to roughening treatment and subjected to Zn—Ni plating treatment as heat-resistant treatment. Further, immersion chromate treatment was performed as rust-proofing treatment. Furthermore, silane treatment was performed on the rust-proofing treatment layer. Silane concentration was set to 5.0 vol %.

Other conditions were set to the same as those in Example 1. As a result, the copper foil surface roughness Rz after silane coupling treatment was found to be 1.31 mm. These treatment conditions are shown in Table 2.

As a result of determining the mass (μg) of adhering Si in the same manner as in Example 1, the mass of adhering Si was found to be 50.6 μg/dm², and the mass of adhering N was found to be 60.9 μg/dm². The above results have satisfied the conditions of the present invention that the amount of adhesion of Si on the copper foil surface is from 3.1 to 300 μg/dm², and the amount of adhesion of N on the copper foil surface is from 2.5 to 690 μg/dm².

As a result of the foregoing, a high value of 1.01 kg/cm was obtained as the 90 degree peel strength. These results are shown in Table 3. As shown in this Example 26, it is found that the surface-treated electrolytic copper foil of Example 26 has industrially sufficient surface performance as a material for a circuit substrate for high frequency.

Example 27

A glossy surface of an electrolytic copper foil having a thickness of 12 μm was subjected to roughening treatment and subjected to Ni—Mo plating treatment as heat-resistant treatment. Further, immersion chromate treatment was performed as rust-proofing treatment. Furthermore, silane treatment was performed on the rust-proofing treatment layer. Silane concentration was set to 5.0 vol %.

Other conditions were set to the same as those in Example 1. As a result, the copper foil surface roughness Rz after silane coupling treatment was found to be 1.42 mm. These treatment conditions are shown in Table 2.

As a result of determining the mass (μg) of adhering Si in the same manner as in Example 1, the mass of adhering Si was found to be 55.5 μg/dm², and the mass of adhering N was found to be 64.7 μg/dm². The above results have satisfied the conditions of the present invention that the amount of adhesion of Si on the copper foil surface is from 3.1 to 300 µg/dm², and the amount of adhesion of N on the copper foil surface is from 2.5 to 690 µg/dm².

As a result of the foregoing, a high value of 1.18 kg/cm was obtained as the 90 degree peel strength. These results are shown in Table 3. As shown in this Example 27, it is found that the surface-treated electrolytic copper foil of Example 27 has industrially sufficient surface performance as a material for a circuit substrate for high frequency.

Example 28

A rolled copper foil (tough pitch copper (JIS H3100, alloy number C1100) manufactured by JX Nippon Mining & Metals Corporation) having a thickness of 9 µm was subjected to roughening treatment under the following conditions, followed by silane coupling treatment. Note that the roughening treatment was performed by performing treatment of providing copper primary particles on the surface of the rolled copper foil and then performing treatment of providing secondary particles. Further, N-2-(aminoethyl)-3-aminopropyltrimethoxysilane was used as a silane for silane treatment, and the silane concentration was set to 5.0 vol %. As a result, the copper foil surface roughness Rz after silane coupling treatment was found to be 0.91 µm.

<Roughening Treatment Conditions>
(Plating Conditions of Copper Primary Particles)
Solution composition: 10 to 20 g/L of copper and 50 to 100 g/L of sulfuric acid
Solution temperature: 25 to 50° C.
Current density: 1 to 58 A/dm²
Plating time: 0.1 to 10 seconds
(Plating Conditions of Secondary Particles)
Solution composition: 10 to 20 g/L of copper, 5 to 15 g/L of nickel, and 5 to 15 g/L of cobalt
pH: 2 to 3
Solution temperature: 30 to 50° C.
Current density: 24 to 50 A/dm²
Plating time: 0.5 to 4 seconds As a result of determining the mass (µg) of adhering Si in the same manner as in Example 1, the mass of adhering Si was found to be 75.3 µg/dm², and the mass of adhering N was found to be 89.3 µg/dm². The above results have satisfied the conditions of the present invention that the amount of adhesion of Si on the copper foil surface is from 3.1 to 300 µg/dm², and the amount of adhesion of N on the copper foil surface is from 2.5 to 690 µg/dm². As a result of the foregoing, a 90 degree peel strength of 0.95 kg/cm was obtained.

Further, a photograph of the surface of the surface-treated copper foil after silane treatment was taken using a scanning electron microscope (SEM). Then, the particles for roughening treatment were observed using the photograph. As a result, the copper primary particle layer had an average particle size of 0.25 to 0.45 µm, and the secondary particle layer had an average particle size of 0.05 to 0.25 µm. Note that the minimum diameter of a circle surrounding each of the particles was measured as a particle size to calculate the average particle size.

These are shown in Table 3. As shown in this Example 28, it is found that the surface-treated copper foil of Example 28 has industrially sufficient surface performance as a material for a circuit substrate for high frequency.

Example 29

A rolled copper foil (tough pitch copper (JIS H3100, alloy number C1100) manufactured by JX Nippon Mining & Metals Corporation) having a thickness of 9 µm was subjected to roughening treatment under the following conditions, followed by electrolytic chromate treatment and then followed by silane coupling treatment. Note that the roughening treatment was performed by performing treatment of providing copper primary particles on the surface of the rolled copper foil and then performing treatment of providing secondary particles. Further, N-2-(aminoethyl)-3-aminopropyltrimethoxysilane was used as a silane for silane treatment, and the silane concentration was set to 5.0 vol %. As a result, the copper foil surface roughness Rz after silane coupling treatment was found to be 0.91 µm.

<Roughening Treatment Conditions>
(Plating Conditions of Copper Primary Particles)
Solution composition: 10 to 20 g/L of copper and 50 to 100 g/L of sulfuric acid
Solution temperature: 25 to 50° C.
Current density: 1 to 58 A/dm²
Plating time: 0.1 to 10 seconds
(Plating Conditions of Secondary Particles)
Solution composition: 10 to 20 g/L of copper, 5 to 15 g/L of nickel, and 5 to 15 g/L of cobalt
pH: 2 to 3
Solution temperature: 30 to 50° C.
Current density: 24 to 50 A/dm²
Plating time: 0.5 to 4 seconds As a result of determining the mass (µg) of adhering Si in the same manner as in Example 1, the mass of adhering Si was found to be 76.2 µg/dm², and the mass of adhering N was found to be 88.5 µg/dm². The above results have satisfied the conditions of the present invention that the amount of adhesion of Si on the copper foil surface is from 3.1 to 300 µg/dm², and the amount of adhesion of N on the copper foil surface is from 2.5 to 690 µg/dm². As a result of the foregoing, a 90 degree peel strength of 0.96 kg/cm was obtained.

Further, a photograph of the surface of the surface-treated copper foil after silane treatment was taken using a scanning electron microscope (SEM). Then, the particles for roughening treatment were observed using the photograph. As a result, the copper primary particle layer had an average particle size of 0.25 to 0.45 µm, and the secondary particle layer had an average particle size of 0.05 to 0.25 µm. Note that the minimum diameter of a circle surrounding each of the particles was measured as a particle size to calculate the average particle size.

These are shown in Table 3. As shown in this Example 29, it is found that the surface-treated copper foil of Example 29 has industrially sufficient surface performance as a material for a circuit substrate for high frequency.

Example 30

A rolled copper foil (tough pitch copper (JIS H3100, alloy number C1100) manufactured by JX Nippon Mining & Metals Corporation) having a thickness of 9 µm was subjected to roughening treatment under the following conditions, followed by electrolytic chromate treatment and then followed by silane coupling treatment. Note that the roughening treatment was performed by performing treatment of providing copper primary particles on the surface of the rolled copper foil and then performing treatment of providing secondary particles. Further, N-2-(aminoethyl)-3-aminopropyltrimethoxysilane was used as a silane for silane treatment, and the silane concentration was set to 5.0 vol %. As a result, the copper foil surface roughness Rz after silane coupling treatment was found to be 0.90 µm.

<Roughening Treatment Conditions>
(Plating Conditions of Copper Primary Particles)
Solution composition: 10 to 20 g/L of copper and 50 to 100 g/L of sulfuric acid
Solution temperature: 25 to 50° C.
Current density: 1 to 58 A/dm$^2$
Plating time: 0.1 to 10 seconds
(Plating Conditions of Secondary Particles)
Solution composition: 10 to 20 g/L of copper, 5 to 15 g/L of nickel, and 5 to 15 g/L of cobalt
pH: 2 to 3
Solution temperature: 30 to 50° C.
Current density: 24 to 50 A/dm$^2$
Plating time: 0.5 to 4 seconds As a result of determining the mass (μg) of adhering Si in the same manner as in Example 1, the mass of adhering Si was found to be 77.0 μg/dm$^2$, and the mass of adhering N was found to be 90.1 μg/dm$^2$. The above results have satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$. As a result of the foregoing, a 90 degree peel strength of 0.96 kg/cm was obtained.

Further, a photograph of the surface of the surface-treated copper foil after silane treatment was taken using a scanning electron microscope (SEM). Then, the particles for roughening treatment were observed using the photograph. As a result, the copper primary particle layer had an average particle size of 0.25 to 0.45 μm, and the secondary particle layer had an average particle size of 0.05 to 0.25 μm. Note that the minimum diameter of a circle surrounding each of the particles was measured as a particle size to calculate the average particle size.

These are shown in Table 3. As shown in this Example 30, it is found that the surface-treated copper foil of Example 30 has industrially sufficient surface performance as a material for a circuit substrate for high frequency.

Example 31

A rolled copper foil (tough pitch copper (JIS H3100, alloy number C1100) manufactured by JX Nippon Mining & Metals Corporation) having a thickness of 12 μm was subjected to electrolytic chromate treatment, followed by silane coupling treatment. N-2-(aminoethyl)-3-aminopropyltrimethoxysilane was used as a silane for silane treatment, and the silane concentration was set to 5.0 vol %. As a result, the copper foil surface roughness Rz after silane coupling treatment was found to be 0.62 μm.

As a result of determining the mass (μg) of adhering Si in the same manner as in Example 1, the mass of adhering Si was found to be 76.1 μg/dm$^2$, and the mass of adhering N was found to be 89.0 μg/dm$^2$. The above results have satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$. As a result of the foregoing, a 90 degree peel strength of 0.67 kg/cm was obtained.

These are shown in Table 3. As shown in this Example 31, it is found that the surface-treated copper foil of Example 31 has industrially sufficient surface performance as a material for a circuit substrate for high frequency.

Example 32

A high gloss rolled copper foil (tough pitch copper (JIS H3100, alloy number C1100) having a 60 degree specular gloss of 500% or greater, manufactured by JX Nippon Mining & Metals Corporation) having a thickness of 12 μm was subjected to silane coupling treatment. N-2-(aminoethyl)-3-aminopropyltrimethoxysilane was used as a silane for silane treatment, and the silane concentration was set to 5.0 vol %. As a result, the copper foil surface roughness Rz after silane coupling treatment was found to be 0.31 μm.

As a result of determining the mass (μg) of adhering Si in the same manner as in Example 1, the mass of adhering Si was found to be 75.6 μg/dm$^2$, and the mass of adhering N was found to be 88.9 μg/dm$^2$. The above results have satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$. As a result of the foregoing, a 90 degree peel strength of 0.61 kg/cm was obtained.

These are shown in Table 3. As shown in this Example 32, it is found that the surface-treated copper foil of Example 32 has industrially sufficient surface performance as a material for a circuit substrate for high frequency.

Example 33

A SiN film was formed under the following sputtering conditions on a high gloss rolled copper foil (tough pitch copper (JIS H3100, alloy number C1100) having a 60 degree specular gloss of 500% or greater, manufactured by JX Nippon Mining & Metals Corporation) having a thickness of 12 μm. The copper foil surface roughness Rz after sputtering was found to be 0.30 μm.

(Target): 59.5 mass % or greater of Si and 39.5 mass % or greater of N.
(Apparatus) Sputtering apparatus manufactured by ULVAC Inc.
(Output) DC 50 W
(Argon pressure) 0.2 Pa As a result of determining the mass (μg) of adhering Si in the same manner as in Example 1, the mass of adhering Si was found to be 90.6 μg/dm$^2$, and the mass of adhering N was found to be 60.4 μg/dm$^2$. The above results have satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$. As a result of the foregoing, a 90 degree peel strength of 0.65 kg/cm was obtained.

These are shown in Table 3. As shown in this Example 33, it is found that the surface-treated copper foil of Example 33 has industrially sufficient surface performance as a material for a circuit substrate for high frequency.

Next, examples in the case of changing the type of copper foil, roughening treatment, heat-resistant treatment, and rust-proofing treatment will be shown. In this case, N-2-(aminoethyl)-3-aminopropyltrimethoxysilane was used as a silane, and silane concentration was set to 0.5 vol %. Drying after silane treatment was all set to 100° C.×3 seconds.

Furthermore, in Comparative Example 21 to Comparative Example 27, the type of base materials and the conditions of roughening treatment, rust-proofing treatment, and chromate treatment are the same as those in Example 21 to Example 27, and examples in the case of changing only silane concentration (the amount of adhesion of Si and N necessarily changes) will be shown.

Comparative Example 21

A rolled copper foil having a thickness of 6 μm was subjected to roughening treatment and subjected to Ni—Co plating treatment as heat-resistant treatment. Further, electrolytic chromate treatment was performed as rust-proofing treatment. Furthermore, silane treatment was performed on the rust-proofing treatment layer. Silane concentration was set to 5.0 vol %. Note that a silane concentration of 0.5 vol % is a concentration generally set in silane treatment. Further, since the specific gravity of silane is about 1.0, 0.5 vol % means about 0.5 wt %.

Other conditions were set to the same as those in Example 1. These treatment conditions are shown in Table 2. As a result, the copper foil surface roughness Rz after silane coupling treatment was found to be 0.82 μm.

As a result of determining the mass (μg) of adhering Si in the same manner as in Example 1, the mass of adhering Si was found to be 0.7 μg/dm$^2$, and the mass of adhering N was found to be 0.9 μg/dm$^2$. The above results did not satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$.

As a result of the foregoing, the 90 degree peel strength was reduced to 0.29 kg/cm. These results are shown in Table 3. As shown in this Comparative Example 21, the surface-treated rolled copper foil of Comparative Example 21 did not have expected industrially sufficient surface performance as a material for a circuit substrate for high frequency.

Comparative Example 22

A rolled copper foil having a thickness of 12 μm was subjected to roughening treatment and subjected to Zn—Ni plating treatment as heat-resistant treatment. Further, immersion chromate treatment was performed as rust-proofing treatment. Furthermore, silane treatment was performed on the rust-proofing treatment layer. Silane concentration was set to 0.5 vol %.

Other conditions were set to the same as those in Example 1. These treatment conditions are shown in Table 2. As a result, the copper foil surface roughness Rz after silane coupling treatment was found to be 0.90 μm.

As a result of determining the mass (μg) of adhering Si in the same manner as in Example 1, the mass of adhering Si was found to be 0.8 μg/dm$^2$, and the mass of adhering N was found to be 1.1 μg/dm$^2$. The above results did not satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$.

As a result of the foregoing, the 90 degree peel strength was reduced to 0.32 kg/cm. These results are shown in Table 3. As shown in this Comparative Example 22, the surface-treated rolled copper foil of Comparative Example 22 did not have expected industrially sufficient surface performance as a material for a circuit substrate for high frequency.

Comparative Example 23

A rolled copper foil having a thickness of 35 μm was subjected to roughening treatment and subjected to Ni—Mo plating treatment as heat-resistant treatment. Further, immersion chromate treatment was performed as rust-proofing treatment. Furthermore, silane treatment was performed on the rust-proofing treatment layer. Silane concentration was set to 0.5 vol %.

Other conditions were set to the same as those in Example 1. These treatment conditions are shown in Table 2. As a result, the copper foil surface roughness Rz after silane coupling treatment was found to be 1.55 μm.

As a result of determining the mass (μg) of adhering Si the same manner as in Example 1, the mass of adhering Si was found to be 1.5 μg/dm$^2$, and the mass of adhering N was found to be 1.5 μg/dm$^2$. The above results did not satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$.

As a result of the foregoing, the 90 degree peel strength was reduced to 0.70 kg/cm. These results are shown in Table 3. As shown in this Comparative Example 23, the surface-treated rolled copper foil of Comparative Example 23 did not have expected industrially sufficient surface performance as a material for a circuit substrate for high frequency.

Comparative Example 24

A rolled copper foil having a thickness of 18 μm was subjected to roughening treatment and subjected to Cu—Zn plating treatment as heat-resistant treatment. Further, electrolytic chromate treatment was performed as rust-proofing treatment. Furthermore, silane treatment was performed on the rust-proofing treatment layer. Silane concentration was set to 0.5 vol %.

Other conditions were set to the same as those in Example 1. These treatment conditions are shown in Table 2. As a result, the copper foil surface roughness Rz after silane coupling treatment was found to be 0.81 μm.

As a result of determining the mass (μg) of adhering Si in the same manner as in Example 1, the mass of adhering Si was found to be 0.9 μg/dm$^2$, and the mass of adhering N was found to be 1.3 μg/dm$^2$. The above results did not satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$.

As a result of the foregoing, the 90 degree peel strength was remarkably reduced to 0.30 kg/cm. These results are shown in Table 3. As shown in this Comparative Example 24, the surface-treated rolled copper foil of Comparative Example 24 did not have industrially sufficient surface performance as a material for a circuit substrate for high frequency.

Comparative Example 25

A glossy surface of an electrolytic copper foil having a thickness of 18 μm was subjected to roughening treatment and subjected to Ni—Co plating treatment as heat-resistant treatment. Further, electrolytic chromate treatment was performed as rust-proofing treatment. Furthermore, silane treatment was performed on the rust-proofing treatment layer. Silane concentration was set to 0.5 vol %.

Other conditions were set to the same as those in Example 1. These treatment conditions are shown in Table 2. As a result, the copper foil surface roughness Rz after silane coupling treatment was found to be 1.62 μm.

As a result of determining the mass (μg) of adhering Si in the same manner as in Example 1, the mass of adhering Si was found to be 1.9 μg/dm$^2$, and the mass of adhering N was found to be 1.7 μg/dm$^2$. The above results did not satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$.

As a result of the foregoing, the 90 degree peel strength was reduced to 0.65 kg/cm. These results are shown in Table 3. As shown in this Comparative Example 25, the surface-treated electrolytic copper foil of Comparative Example 25 did not have expected industrially sufficient surface performance as a material for a circuit substrate for high frequency.

Comparative Example 26

An electrolytic copper foil having a thickness of 5 μm was subjected to roughening treatment and subjected to Zn—Ni plating treatment as heat-resistant treatment. Further, immersion chromate treatment was performed as rust-proofing treatment. Furthermore, silane treatment was performed on the rust-proofing treatment layer. Silane concentration was set to 0.5 vol %.

Other conditions were set to the same as those in Example 1. These treatment conditions are shown in Table 2. As a result, the copper foil surface roughness Rz after silane coupling treatment was found to be 1.31 μm.

As a result of determining the mass (μg) of adhering Si in the same manner as in Example 1, the mass of adhering Si was found to be 1.7 μg/dm$^2$, and the mass of adhering N was found to be 2.1 μg/dm$^2$. The above results did not satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$.

As a result of the foregoing, the 90 degree peel strength was reduced to 0.44 kg/cm. These results are shown in Table 3. As shown in this Comparative Example 26, the surface-treated electrolytic copper foil of Comparative Example 26 did not have expected industrially sufficient surface performance as a material for a circuit substrate for high frequency.

Comparative Example 27

An electrolytic copper foil having a thickness of 12 μm was subjected to roughening treatment and subjected to Ni—Mo plating treatment as heat-resistant treatment. Further, immersion chromate treatment was performed as rust-proofing treatment. Furthermore, silane treatment was performed on the rust-proofing treatment layer. Silane concentration was set to 0.5 vol %.

Other conditions were set to the same as those in Example 1. These treatment conditions are shown in Table 2. As a result, the copper foil surface roughness Rz after silane coupling treatment was found to be 1.42 μm.

As a result of determining the mass (μg) of adhering Si in the same manner as in Example 1, the mass of adhering Si was found to be 1.9 μg/dm$^2$, and the mass of adhering N was found to be 2.0 μg/dm$^2$. The above results did not satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$.

As a result of the foregoing, the 90 degree peel strength was reduced to 0.45 kg/cm. These results are shown in Table 3. As shown in this Comparative Example 27, the surface-treated electrolytic copper foil of Comparative Example 27 did not have expected industrially sufficient surface performance as a material for a circuit substrate for high frequency.

Comparative Example 28

A glossy surface of an electrolytic copper foil having a thickness of 12 μm was subjected to Ni—Zn plating treatment as heat-resistant treatment. Further, electrolytic chromate treatment was performed as rust-proofing treatment. Furthermore, silane treatment was performed on the rust-proofing treatment layer. Silane concentration was set to 0.5 vol %.

Other conditions were set to the same as those in Example 1. These treatment conditions are shown in Table 2. Note that as a result, the copper foil surface roughness Rz after silane coupling treatment was found to be 0.60 μm. Further, the amount of adhesion of Ni and Zn at this time was found to be 600 μg/dm$^2$ and 90 μg/dm$^2$, respectively.

As a result of determining the mass (μg) of adhering Si in the same manner as in Example 1, the mass of adhering Si was found to be 1.1 μg/dm$^2$, and the mass of adhering N was found to be 1.4 μg/dm$^2$. The above results did not satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$.

As a result of the foregoing, the 90 degree peel strength was as low as 0.10 kg/cm. These results are shown in Table 3. As shown in this Comparative Example 28, the surface-treated electrolytic copper foil of Comparative Example 28 did not have expected industrially sufficient surface performance as a material for a circuit substrate for high frequency. Note that when this copper foil is bonded to a polyimide to measure peel strength, the strength is found to be 0.8 kg/cm, then it can be verified that peel strength greatly differs depending on a resin.

Comparative Example 29

An electrolytic copper foil having a thickness of 12 μm was subjected to roughening treatment and subjected to Ni—Mo plating treatment as heat-resistant treatment. Further, immersion chromate treatment was performed as rust-proofing treatment. Furthermore, silane treatment was performed on the rust-proofing treatment layer. Silane concentration was set to 0.5 vol %.

Other conditions were set to the same as those in Example 1. These treatment conditions are shown in Table 2. As a result, the copper foil surface roughness Rz after silane coupling treatment was found to be 0.61 μm. Further, the amount of adhesion of Ni and Zn at this time was found to be 2850 μg/dm$^2$ and 190 μg/dm$^2$, respectively.

As a result of determining the mass (μg) of adhering Si in the same manner as in Example 1, the mass of adhering Si was found to be 1.4 μg/dm$^2$, and the mass of adhering N was found to be 1.7 μg/dm$^2$. The above results did not satisfied the conditions of the present invention that the amount of adhesion of Si on the copper foil surface is from 3.1 to 300 μg/dm$^2$, and the amount of adhesion of N on the copper foil surface is from 2.5 to 690 μg/dm$^2$.

As a result of the foregoing, the 90 degree peel strength was as low as 0.11 kg/cm. These results are shown in Table 3. As shown in this Comparative Example 29, the surface-treated electrolytic copper foil of Comparative Example 29 did not have expected industrially sufficient surface performance as a material for a circuit substrate for high frequency. Note that when this copper foil is bonded to a polyimide to measure peel strength, the strength is found to be 1.2 kg/cm, then it can be verified that peel strength greatly differs depending on a resin.

INDUSTRIAL APPLICABILITY

A copper foil for high frequency circuits can be produced by the present invention, and application of the copper foil to a liquid crystal polymer (LCP) laminated substrate allows adhesive strength (peel strength) to be increased and provides an excellent effect that a flexible printed circuit board which can be used at a high frequency exceeding 1 GHz can be achieved. Thus, the present invention is extremely useful industrially.

The invention claimed is:

1. A surface-treated copper foil, comprising:
a copper surface, and
an outermost layer including Si and N disposed over the copper surface, wherein:
the outermost layer is a dry plated layer or an aminosilane coupling treatment layer,
an amount of adhesion of Si in the outermost layer is in a range of 5.8 μg/dm² to 115.0 μg/dm²,
an amount of adhesion of N in the outermost layer is in a range of 13.0 μg/dm² to 187.2 μg/dm², and
a surface roughness Rz of the outermost layer is 0.30 μm to 0.92 μm, inclusive.

2. The surface-treated copper foil according to claim 1, wherein the amount of adhesion of Si in the outermost layer is from 5.8 μg/dm² to 90.6 μg/dm², the amount of adhesion of N in the outermost layer is from 13.0 μg/dm² to 89.0 μg/dm², and the surface roughness Rz of the outermost layer is 0.85 μm or less.

3. The surface-treated copper foil according to claim 1, wherein the amount of adhesion of Si in the outermost layer is from 20.5 μg/dm² to 90.6 μg/dm², the amount of adhesion of N in the outermost layer is from 16.4 μg/dm² to 89.0 μg/dm², and the surface roughness Rz of the outermost layer is 0.85 μm or less.

4. The surface-treated copper foil according to claim 1, wherein the copper foil is a rolled copper foil or an electrolytic copper foil.

5. The surface-treated copper foil according to claim 1, wherein the copper foil is joined to a flexible printed circuit board which can be used under a high frequency exceeding 1 GHz.

6. The surface-treated copper foil according to claim 1, wherein:
the outermost layer is an aminosilane coupling treatment layer, and
the copper foil comprises at least one layer selected from the group consisting of a roughening treatment layer, a heat-resistant treatment layer, a rust-proofing treatment layer, and a chromate treatment layer disposed between the copper surface and the aminosilane coupling treatment layer.

7. The surface-treated copper foil according to claim 6, wherein the copper foil has a chromate treatment layer on the copper surface, and the aminosilane coupling treatment layer on the chromate treatment layer.

8. The surface-treated copper foil according to claim 6, wherein the copper foil has a roughening treatment layer on the copper surface, a chromate treatment layer on the roughening treatment layer, and the aminosilane coupling treatment layer on the chromate treatment layer.

9. The surface-treated copper foil according to claim 6, wherein the copper foil has a roughening treatment layer on the copper surface, a rust-proofing treatment layer on the roughening treatment layer, a chromate treatment layer on the rust-proofing treatment layer, and the aminosilane coupling treatment layer on the chromate treatment layer.

10. The surface-treated copper foil according to claim 6, wherein the copper foil has a roughening treatment layer on the copper surface, wherein the roughening treatment layer has a primary particle layer and a secondary particle layer on the primary particle layer.

11. The surface-treated copper foil according to claim 10, wherein the roughening treatment layer has a primary particle layer of copper, and has a secondary particle layer made of a ternary alloy comprising copper, cobalt, and nickel on the primary particle layer.

12. The surface-treated copper foil according to claim 10, wherein the roughening treatment layer has a primary particle layer of copper, and has a secondary particle layer made of a ternary alloy comprising copper, cobalt, and nickel on the primary particle layer, wherein the primary particle layer has an average particle size of 0.25 μm to 0.45 μm, and the secondary particle layer has an average particle size of 0.05 μm to 0.25 μm.

13. The surface-treated copper foil according to claim 10, wherein the copper foil has a chromate treatment layer on the roughening treatment layer, and the aminosilane coupling treatment layer on the chromate treatment layer.

14. The surface-treated copper foil according to claim 10, wherein the copper foil has a rust-proofing treatment layer on the roughening treatment layer, a chromate treatment layer on the rust-proofing treatment layer, and the aminosilane coupling treatment layer on the chromate treatment layer.

15. A printed circuit structure comprising:
a flexible printed circuit substrate comprising a liquid crystal polymer having a surface that is laminated to an outermost layer of a surface-treated copper foil, comprising:
a copper surface, and
an outermost layer including Si and N disposed over the copper surface, wherein:
the outermost layer is a dry plated layer or an aminosilane coupling treatment layer,
an amount of adhesion of Si in the outermost layer is in a range of 5.8 μg/dm² to 115.0 μg/dm²,
an amount of adhesion of N in the outermost layer is in a range of 13.0 μg/dm² to 187.2 μg/dm², and
a surface roughness Rz of the outermost layer is 0.30 μm to 0.92 μm, inclusive.

16. The printed circuit structure according to claim 15, wherein:
the surface-treated copper foil has an ordinary peel strength at 90 degrees of 0.48 kg/cm or greater.

* * * * *